United States Patent
Deng et al.

(10) Patent No.: US 7,656,229 B2
(45) Date of Patent: Feb. 2, 2010

(54) METHOD AND APPARATUS FOR REDUCING INTERMODULATION DISTORTION IN AN ELECTRONIC DEVICE HAVING AN AMPLIFIER CIRCUIT

(75) Inventors: Junxiong Deng, San Diego, CA (US); Li Liu, San Diego, CA (US); Prasad S. Gudem, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 60 days.

(21) Appl. No.: 12/021,061

(22) Filed: Jan. 28, 2008

(65) Prior Publication Data

US 2009/0189691 A1    Jul. 30, 2009

(51) Int. Cl.
  H03F 3/38    (2006.01)
(52) U.S. Cl. ............................... 330/149; 375/296
(58) Field of Classification Search .......... 330/149; 455/114.3; 375/296–297
  See application file for complete search history.

(56) References Cited

U.S. PATENT DOCUMENTS

| | | | |
|---|---|---|---|
| 7,250,815 B2 * | 7/2007 | Taylor et al. | 330/107 |
| 7,414,461 B2 * | 8/2008 | DeVolk | 327/552 |
| 2004/0072554 A1 * | 4/2004 | Henderson et al. | 455/341 |
| 2005/0110555 A1 | 5/2005 | Nakatani | |

FOREIGN PATENT DOCUMENTS

EP    1253708    10/2002

OTHER PUBLICATIONS

Chun-Wah Fan and Kwok-Keung M. Cheng, "Amplifier Linearization Using Simultaneous Harmonic and Baseband Injection," IEEE Microwave and Wireless Components Letters, vol. 11, No. 10, Oct. 2001.
Fadhel M. Ghannouchi, J-S Cardinal, and R. Hajji, "An Adaptive Linearizer Using Feedback and Dynamic Biasing Techniques for SSPAs," SBMO/IEEE MTT-S IMOC '95 Proceedings, 1995.

(Continued)

*Primary Examiner*—Robert Pascal
*Assistant Examiner*—Hieu P Nguyen
(74) *Attorney, Agent, or Firm*—Larry Moskowitz; William M. Hooks

(57) ABSTRACT

An electronic device includes an amplifier circuit coupled to a linearizer. The amplifier circuit may receive a first input signal including first and second frequencies and generate a first output signal including a delta frequency signal at a delta frequency, which is the difference between the first frequency and the second frequency. The linearizer includes a signal detector circuit, a current-mirror circuit, a low pass filter, a phase shifter, and a bias circuit. The signal detector circuit may generate a second output signal. The current-mirror circuit may adjust an amplitude of a signal. The low pass filter may eliminate a portion of the second output signal having frequencies greater than the delta frequency. The phase shifter may generate a feedback signal corresponding to the delta frequency signal. An amplitude and/or a phase of the feedback signal is different from an amplitude and/or a phase of the delta frequency signal.

26 Claims, 14 Drawing Sheets

OTHER PUBLICATIONS

Wei-Chen Hua, Hung-Hui Lai, Po-Tsung Lin, Chee Wee Liu, Tzu-Yi Yang, and Gin-Kou Ma, "High-Linearity and Temperature-Insensitive 2.4 GHz SiGe Power Amplifier with Dynamic-Bias Control," IEEE Radio Frequency Integrated Circuits Symposium, 2005.

Chi-Shuen Leung and Kwok-Keung M. Cheng, "A New Approach to Amplifier Linearization by the Generalized Baseband Signal Injection Method, IEEE Microwave and Wireless Components Letters," vol. 12, No. 9, Sep. 2002.

Natasa Males-Ilic, Bratislav Milovanovic, and Djuradj Budimir, "Low Intermodulation Amplifiers for RF and Microwave Wireless Systems, Proceedings of APMC2001," Taipei, Taiwan, R.O.C., 2001.

Jia Sun, Yan Wah Michael Chia, and Bin Li, "A New BJT Linearizer Design for RF Power Amplifier," Centre for Wireless Communications, National University of Singapore.

Chun-Wah Fan and Kwok-Keung M. Cheng, "Theoretical and Experimental Study of Amplifier Linearization Based on Harmonic and Baseband Signal Injection Technique," IEEE Transactions on Microwave Theory and Techniques, vol. 50, No. 7, Jul. 2002.

Yongcai Hu, Jean Claude Mollier, and Juan Obregon, "A New Method of Third-Order Intermodulation Reduction in Nonlinear Microwave Systems," IEEE Transactions on Microwave Theory and Techniques, vol. MTT-34, No. 2, Feb. 1986.

W.J. Jenkins and A. Khanifar, "Power Amplifier Linearisation Through Low-Frequency Feedback," Department of Electronic and Electrical Engineering; University College of London, London WC1E 7JE.

Janusz J. Majewski, "New Method of Phase Noise and Intermodulation Distortion Reduction in High-Order QAM Systems," SierraCom, A division of Sierra Networks, Inc., Hopkinton, MA, USA.

M.R. Moazzam and C.S. Aitchison, "A Low Third Order Intermodulation Amplifier with Harmonic Feedback Circuitry," IEEE MTT-S Digest, 1996.

Atchinson, et al., "Improvement of Third-Order Intermodulation Product of RF and Microwave Amplifiers by Injection," IEEE Transactions on Microwave Theory and Techniques, IEEE Service Center, Piscataway, NJ, US, vol. 49, No. 6, Part 2, June 1, 2001.

Hu, et al., "A New Method of Third-Order Intermodulation Reduction in Nonlinear Microwave Systems, " IEEE Transactions on Microwave Theory and Techniques, vol. MTT-34, No. 2, Feb. 1986.

International Search Report, PCT/US2009/032272 - International Search Authority - European Patent Office, Jun. 10, 2009.

Written Opinion, PCT/US2009/032272 - International Search Authority - European Patent Office, Jun. 10, 2009.

* cited by examiner

METHOD AND APPARATUS FOR REDUCING INTERMODULATION DISTORTION IN AN ELECTRONIC DEVICE HAVING AN AMPLIFIER CIRCUIT

BACKGROUND

1. Field

The subject technology relates generally to electronic devices and signal distortion, and more specifically to methods and apparatus for reducing intermodulation distortion in an electronic device having an amplifier circuit.

2. Background

Non-linear systems can introduce intermodulation distortion when multiple signals are amplified. In communication systems such as cellular communication devices, the output spectrum is required to be substantially free of unwanted intermodulation products. Intermodulation distortion within a radio frequency (RF) amplifier can severely impede proper transmission and reception of communication signals. Conventional techniques, however, do not adequately reduce intermodulation distortion.

SUMMARY

In one aspect of the disclosure, an electronic device for reducing intermodulation distortion comprises an amplifier circuit and a linearizer. The amplifier circuit has an input, an output, and a first transistor. The amplifier circuit is configured to receive a first input signal comprising at least a first frequency and a second frequency. The amplifier circuit is also configured to generate a first output signal. The first output signal comprises a delta frequency signal at a delta frequency. The delta frequency comprises a difference between the first frequency and the second frequency.

The linearizer has an input and an output. The input of the linearizer is coupled to the amplifier circuit. The output of the linearizer is coupled to the input of the amplifier circuit. The linearizer comprises a signal detector circuit, a current-mirror circuit, a low pass filter, a phase shifter, and a bias circuit.

The signal detector circuit is coupled to the amplifier circuit. The signal detector circuit has an input, an output, and a second transistor. The signal detector circuit is configured to generate a second output signal comprising at least the delta frequency. The current-mirror circuit is coupled to the signal detector circuit and is configured to adjust an amplitude of an input signal of the current-mirror circuit. The low pass filter is coupled to the current-mirror circuit and is configured to eliminate a portion of the second output signal having a frequency or frequencies that are greater than the delta frequency.

The phase shifter has an input and an output. The output of the phase shifter is coupled to the output of the linearizer. The phase shifter is configured to adjust a phase of an input signal of the phase shifter. The phase shifter is further configured to generate a third output signal. The third output signal comprises a feedback signal corresponding to the delta frequency signal. An amplitude and/or a phase of the feedback signal is different from an amplitude and/or a phase of the delta frequency signal generated by the amplifier circuit, respectively. The bias circuit is configured to provide a bias current or a bias voltage to allow a DC voltage level of an output signal of the linearizer to be at a DC voltage level of the input of the amplifier circuit.

In another aspect of the disclosure, a method is provided for reducing intermodulation distortion in an electronic device. The method comprises receiving a first input signal comprising at least a first frequency and a second frequency and generating a first output signal using an amplifier circuit. The first output signal comprises a delta frequency signal at a delta frequency, and the delta frequency comprises a difference between the first frequency and the second frequency.

The method further comprises detecting a first signal from the amplifier circuit, generating a second signal based on the first signal, adjusting an amplitude of the second signal using a current-mirror circuit, and eliminating a portion of the second signal having a frequency or frequencies that are greater than the delta frequency to produce a third signal. The method further comprises providing a bias current or a bias voltage, adjusting a phase of the third signal, generating a fourth signal based on the third signal, and providing the fourth signal to an input of the amplifier circuit.

The fourth signal comprises a feedback signal corresponding to the delta frequency signal generated by the amplifier circuit, and an amplitude and/or a phase of the feedback signal is different from an amplitude and/or a phase of the delta frequency signal generated by the amplifier circuit, respectively.

In yet another aspect of the disclosure, an electronic device for reducing intermodulation distortion comprises means for receiving a first input signal comprising at least a first frequency and a second frequency and means for generating a first output signal using an amplifier circuit. The first output signal comprises a delta frequency signal at a delta frequency, and the delta frequency comprises a difference between the first frequency and the second frequency.

The electronic device further comprises means for detecting a first signal from the amplifier circuit, means for generating a second signal based on the first signal, means for adjusting an amplitude of the second signal using a current-mirror circuit, and means for eliminating a portion of the second signal having a frequency or frequencies that are greater than the delta frequency to produce a third signal. The electronic device further comprises means for providing a bias current or a bias voltage, means for adjusting a phase of the third signal, means for generating a fourth signal based on the third signal, and means for providing the fourth signal to an input of the amplifier circuit.

The fourth signal comprises a feedback signal corresponding to the delta frequency signal generated by the amplifier circuit, and an amplitude and/or a phase of the feedback signal is different from an amplitude and/or a phase of the delta frequency signal generated by the amplifier circuit, respectively.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology.

Figure 1:
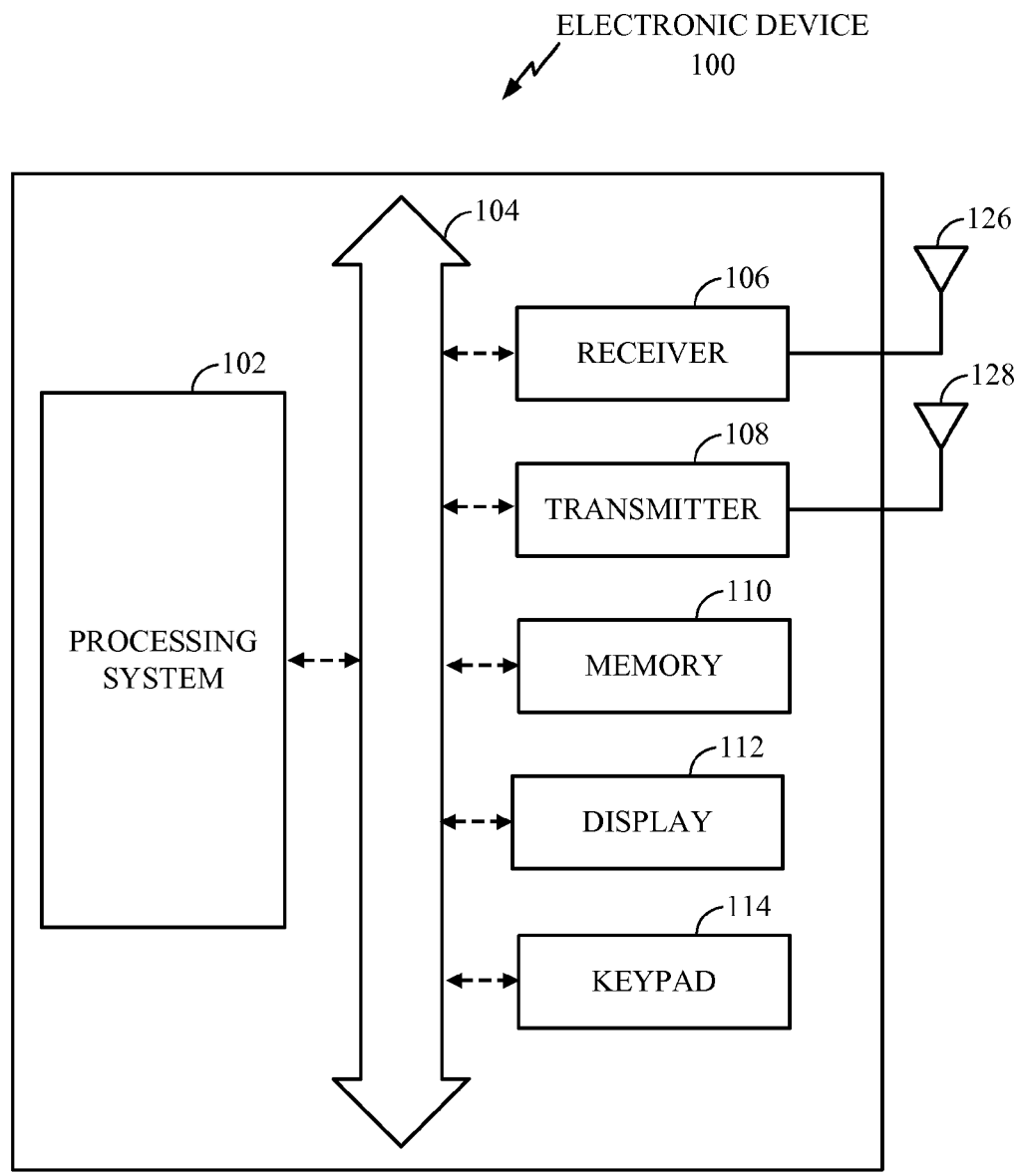
FIG. 1 is a conceptual block diagram illustrating an example of a hardware configuration of an electronic device according to one aspect of the disclosure.

FIG. 1 is a conceptual block diagram illustrating an example of a hardware configuration of an electronic device according to one aspect of the disclosure. An electronic device 100 includes a processing system 102, which is capable of communication with a receiver 106 and a transmitter 108 through a bus 104 or other structures or devices. The receiver 106 may receive signals from an antenna 126, and the transmitter 108 may transmit signals using an antenna 128. It should be understood that communication means other than buses can be utilized with the disclosed configurations. The processing system 102 can generate audio, video, multimedia, and/or other types of data to be provided to the transmitter 108 for communication. In addition, audio, video, multimedia, and/or other types of data can be received at the receiver 106, and processed by the processing system 102.

Software programs, which may be stored in the memory 110 or the processing system 102, may be used by the processing system 102 to control and manage access to the various networks, as well as provide other communication and processing functions. Software programs may also provide an interface to the processing system 102 for various user interface devices, such as a display 112 and a keypad 114. The processing system 102 may be implemented using software, hardware, or a combination of both.

While FIG. 1 shows two separate antennas 126 and 128, an electronic device may employ one common antenna for both the receiver 106 and the transmitter 108, or may employ multiple antennas (e.g., each or one of the receiver 106 and the transmitter 108 may include more than one antenna). In another configuration, antennas 126 and 128 may be replaced by wire connections to other systems (e.g., optical fibers, cables).

An electronic device may also include other components that are not shown in FIG. 1 (e.g., peripheral devices) or may include fewer components than what is shown in FIG. 1. The receiver 106 and the transmitter 108 may be combined into a transceiver in another configuration. Some of the functions of the processing system 102 may be performed by one or more of the other blocks shown in FIG. 1, such as the receiver 106 and the transmitter 108, and some of the functions of the receiver 106 and/or the transmitter 108 may be performed by one or more of the other blocks, such as the processing system 102. The electronic device 100 is merely an example, and the subject technology may be practiced in other types of devices. Furthermore, an electronic device such as the electronic device 100 can be utilized in a wireless or wired communications system or other types of systems or devices.

Figure 2:
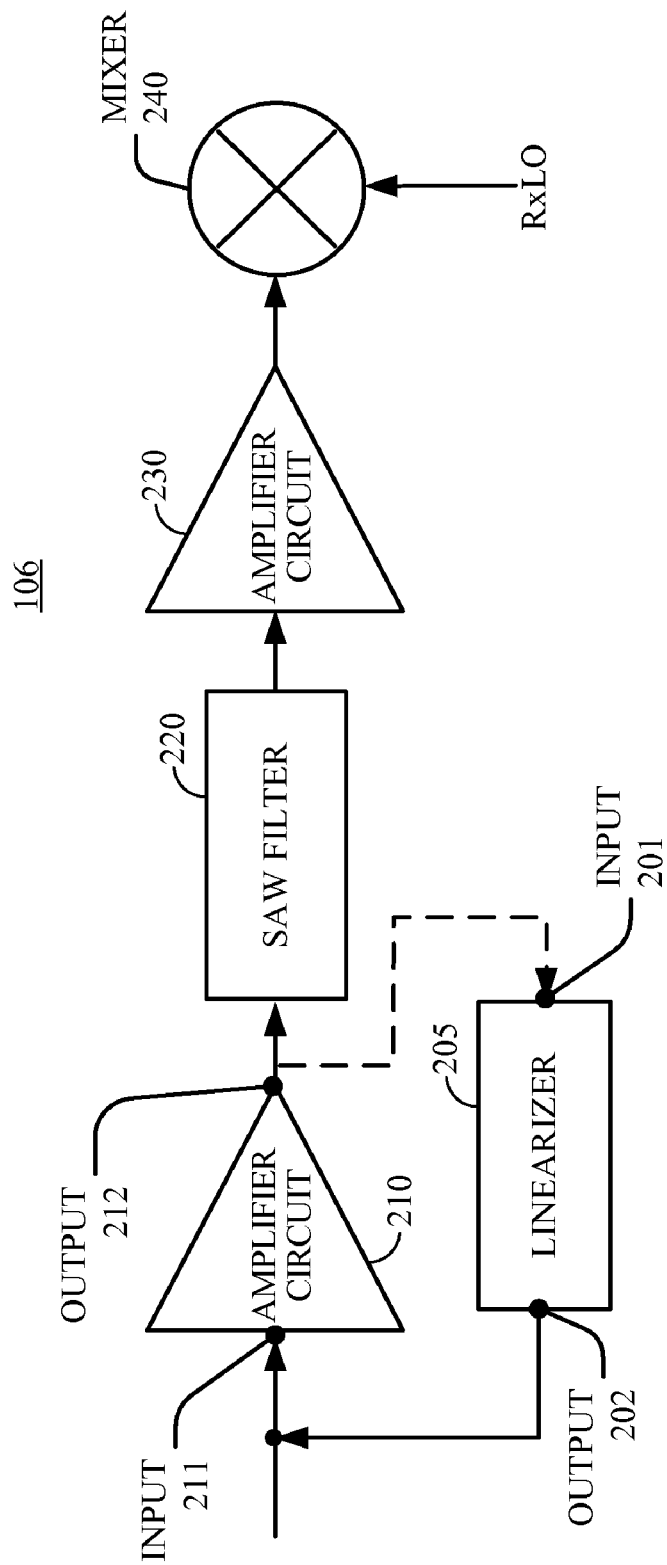
FIG. 2 is a conceptual block diagram illustrating an example of a hardware configuration of a receiver according to one aspect of the disclosure.

FIG. 2 is a conceptual block diagram illustrating an example of a hardware configuration of a receiver according to one aspect of the disclosure. A receiver 106 may include a first amplifier circuit 210, which may be a low noise amplifier (LNA), a linearizer 205, a surface acoustic wave (SAW) filter 220, a second amplifier circuit 230, and a mixer 240. The first amplifier circuit 210 may receive a signal, for example, from a device outside the electronic device 100 wirelessly using the antenna 126 in FIG. 1. The receiver 106 may include additional components or include fewer components than what is shown in FIG. 1.

When the receiver 106 is used, for example, for high-quality wireless communication systems, it is important to keep the intermodulation (IM) distortion low. This requires the first amplifier circuit (e.g., LNA) 210 in the receiver 106 to be very linear. In conventional LNA design, intermodulation spectrum can be severely asymmetrical, degrading the overall linearity of an LNA. One of the major causes is due to the intermodulation delta (beat) frequency interacting with harmonics generated by amplifier nonlinear behavior. To overcome this problem, a delta frequency signal injection method is described herein.

Referring to FIG. 2, the linearizer 205 may be configured to reduce the IM distortion or to improve linearity of the first amplifier circuit 210. The linearizer 205 may have an input 201 and an output 202. The first amplifier circuit 210 may have an input 211 and an output 212. The input 201 of the linearizer 205 may be coupled to the output 212 of the first amplifier circuit 210. In another configuration, the input 201 of the linearizer 205 may be coupled to the input 211 of the first amplifier circuit 210. The output 202 of the linearizer 205 may be coupled to an input of the first amplifier circuit 210 so that an output signal of the linearizer 205 may be fed back to the first amplifier circuit 210. The SAW filter 220 may be used as a bandpass filter, and the amplifier 230 may amplify its input signal. The mixer 240 may downconvert the signal it receives using a receiver local oscillator (RxLO).

It should be noted that an input or an output as described in this disclosure may refer to one or more inputs or outputs, and an input or an output may refer to one or more external nodes or one or more internal nodes of a device. For example, an input or an output of the first amplifier circuit 210 may refer to a node that is internal or external to the first amplifier circuit 210.

FIG. 3A is a conceptual block diagram illustrating an exemplary configuration of an electronic device configured to reduce intermodulation (IM) distortion according to one aspect of the disclosure. An electronic device 300 includes an amplifier circuit 310, such as an LNA, and a linearizer 305. It may further include an input matching network (IMN) 320, a tank circuit 330, and a degeneration inductor $L_{deg}$. The IMN 320 may be used to match the impedance of a main transistor $M_{main}$ 310a of the amplifier circuit 310. The tank circuit 330 may include a tank inductor $L_{tank}$ to provide DC current to the amplifier circuit 310, and a tank capacitor $C_{tank}$ whose resonance with $L_{tank}$ may help the amplifier circuit 310 to work in the desired frequencies. The degeneration inductor $L_{deg}$ may be used to improve linearity and input impedance matching.

The amplifier circuit 310 may include the main transistor $M_{main}$ 310a and a cascode transistor $M_{case}$ 310b. The $M_{main}$ 310a and the $M_{case}$ 310b form a cascode amplifier configuration. The cascode transistor $M_{case}$ 310b may be biased using a cascode voltage at the gate of the $M_{case}$ 310b. In another configuration, an amplifier circuit 310 may include only one transistor—$M_{main}$ 310a—without a cascode transistor.

The electronic device 300 (or more specifically, the amplifier circuit 310 or the $M_{main}$ 310a) may receive an input signal having two frequencies—ω1 and ω2 (see, e.g., FIG. 3B). This can be represented as a circuit 390 for convenience. These two frequencies may be referred to as two radio frequency (RF) tones. The input signal may be received, for example, from an antenna (such as the antenna 126 in FIG. 1). The amplifier circuit 310 (or the $M_{main}$ 310a) can receive an input signal at $V_{in}$ 311, amplify the signal, and generate an output signal at $V_{out}$ 312. The output signal of the amplifier circuit 310 may comprise, among others, a delta frequency, which is the difference between the two frequencies, ω1 and ω2. An exemplary delta frequency, Δω, is shown in FIG. 3B. A signal at the delta frequency is sometimes referred to as a delta frequency signal. The amplifier circuit 310 is coupled to the linearizer 305. A signal may include one or more signals, and thus an input signal may include one or more input signals, and an output signal may include one or more output signals.

The linearizer 305 may include a signal detector circuit 340, an amplitude adjuster 350, a low pass filter (LPF) 360, a bias circuit 370 (including, for example, $I_{bias}$, as shown, or $V_{bias}$), and a phase shifter 380. The signal detector circuit 340 may be coupled to the amplifier circuit 310 (or the $M_{case}$ 310b) and have an input and an output. The signal detector circuit 340 may include one or more transistors. The signal detector circuit 340 may be configured to receive an input signal from the amplifier circuit 310 and generate an output signal. The output signal of the signal detector circuit 340 may be smaller than the output signal of the amplifier circuit 310 in amplitude. The output signal of the signal detector circuit 340 may comprise, among others, the delta frequency. The signal detector circuit 340 may be configured to detect the current signal or the voltage signal of the amplifier circuit 310, and the current flowing through the signal detector circuit 340 is typically much less than the current flowing through the amplifier circuit 310. Thus, in one aspect, the signal detector circuit 340 is configured to sample the signal of the amplifier circuit 310.

The amplitude adjuster 350 may include a current-mirror circuit coupled to the signal detector circuit 340. The current-mirror circuit may be configured to adjust the amplitude of an input signal of the current-mirror circuit. The current-mirror circuit may be tunable (e.g., be able to selectively adjust the amplitude of a signal by a selected amount-either by increasing it or by decreasing it). Thus, the output signal of the current-mirror circuit is amplitude adjusted. In other words, an output signal of the current-mirror circuit may be the same as the input signal of the current-mirror circuit, except that the amplitude of the output signal is different from the amplitude of the input signal. The amplitude of the output signal may be greater or less than the amplitude of its input signal. The current-mirror circuit may be coupled to the LPF 360.

The LPF 360 may be configured to filter out the high frequencies. For example, the LPF 360 may eliminate the high frequency portion of the output signal of the signal detector circuit 340. High frequencies may be frequencies that are greater than a predetermined frequency (e.g., greater than the delta frequency). The LPF 360 may allow the signal at zero frequency (DC signal) and at the delta frequency to pass. An output signal of the LPF 360 may thus include the delta frequency signal.

The bias circuit 370 can be configured to provide the sufficient bias current or bias voltage so that the output 302 of the linearizer 305 is at the same DC voltage level as the input ($V_{in}$ 311) of the amplifier circuit 310. An output signal of the bias circuit 370 may include the delta frequency signal.

The phase shifter 380 includes an input and an output. The phase shifter 380 may be configured to adjust the phase of a signal received by the phase shifter 380 (including the delta frequency signal). In one configuration, the phase shifter 380 may be tunable (e.g., be able to selectively adjust the phase of its input signal by a selected amount—either by increasing it or by decreasing it). In another configuration, the phase shifter 380 adjusts the phase of its input signal by 180°. In yet another configuration, the phase shifter 380 adjusts the phase of its input signal by an amount less than 180°. In yet another configuration, the phase shifter 380 can adjust the phase of its input signal by any amount. In yet another configuration, the phase shifter 380 can adjust the phase of its input signal by any amount, and the amount does not need to be 180°. An output signal of the linearizer 305 does not need to be 180° out of phase of the delta frequency signal generated by the amplifier circuit 310. A phase shifter can be implemented using techniques known to those skilled in the art.

An output signal of the phase shifter 380 may include a delta frequency signal but with its phase adjusted. Thus, the output signal of the phase shifter 380 may be the same as the input signal of the phase shifter 380, except that the phase of the output signal may be different from the phase of the input signal. The phase of the output signal may be greater or less than the phase of its input signal.

The output 302 may be coupled to the input of the amplifier circuit 310 so that the output signal of the linearizer 305 (a feedback signal from the phase shifter 380) can be provided to the input of the amplifier circuit 310. The feedback signal may correspond to the delta frequency signal generated by the amplifier circuit 310 but the amplitude and/or phase of the feedback signal may be different from the amplitude and/or phase of the delta frequency signal generated by the amplifier circuit 310. The amplitude may be adjusted by the current-mirror circuit in the amplifier adjuster 350, and the phase may be adjusted by the phase shifter 380.

A current flowing through the linearizer 305 (e.g., the current flowing into the phase shifter 380, $I_{linearizer}$ 308) may be much less than the current flowing through the amplifier circuit 310 ($I_{amplifier}$ 318). For example, $I_{linearizer}$ 308 may be 20 to 30 times less than $I_{amplifier}$ 318. An output signal of the linearizer 305 at output 302 may comprise a DC bias voltage signal ($V_{bias}$) as well as an AC voltage signal at the delta frequency ($V_{\Delta\omega}$). The DC bias voltage signal is at the same DC voltage level as that at the input ($V_{in}$ 311) of the amplifier circuit 310.

Figure 3:
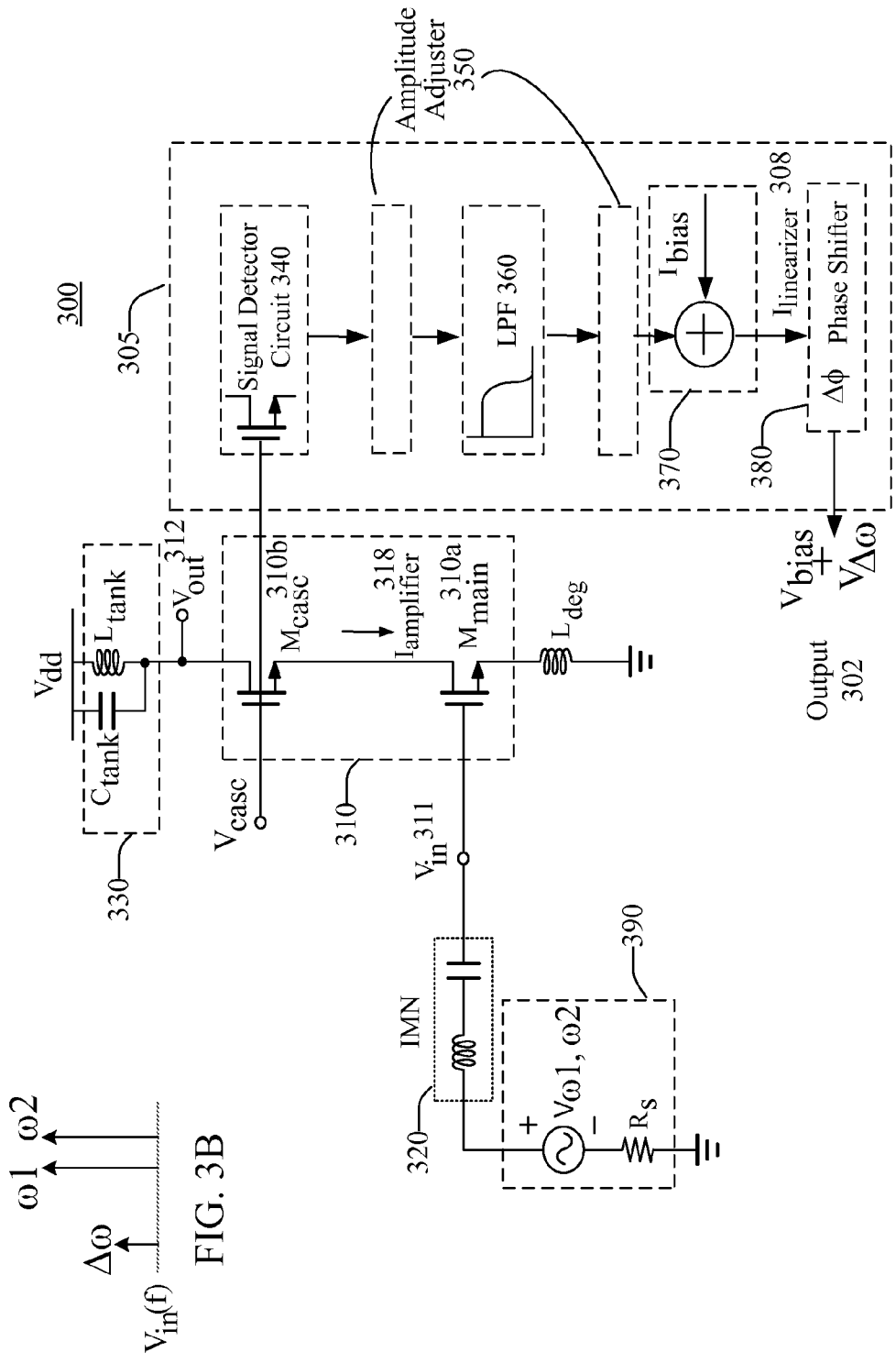
FIG. 3A is a conceptual block diagram illustrating an exemplary configuration of an electronic device according to one aspect of the disclosure.
FIG. 3B is a conceptual block diagram illustrating an input signal comprising two frequencies and a delta frequency signal according to one aspect of the disclosure.
Figure 4:
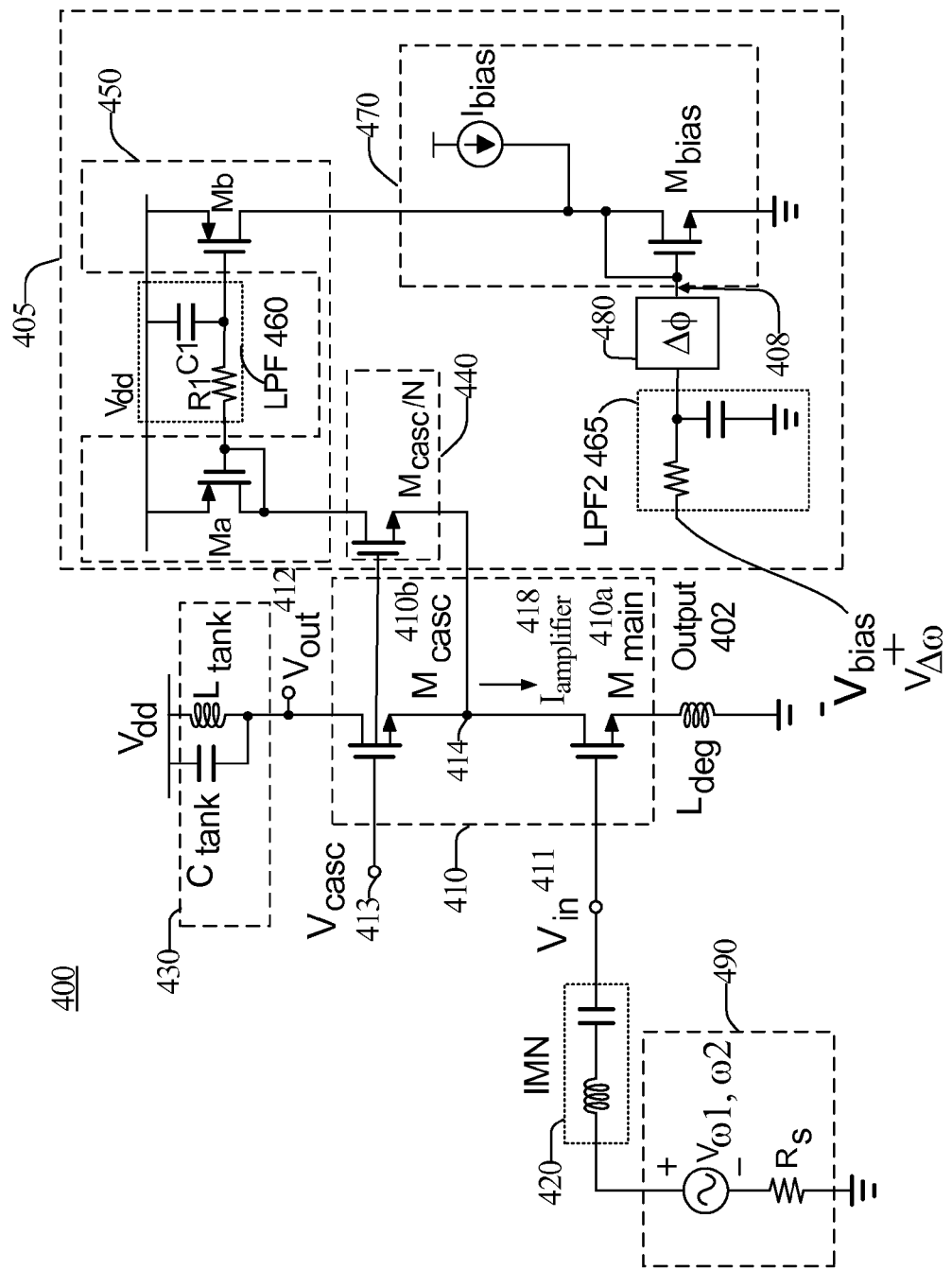
FIG. 4 is a conceptual block diagram illustrating another exemplary configuration of an electronic device utilizing a single-ended, current-mode implementation according to one aspect of the disclosure.

FIG. 4 is a conceptual block diagram illustrating another exemplary configuration of an electronic device according to one aspect of the disclosure. Circuits that have functions similar to those shown in FIG. 3A have similar reference numerals in that circuits with reference numerals 4xx in FIG. 4 may correspond to circuits with reference numerals 3xx in FIG. 3A. For example, circuits 410, 420, 430, 405, 440, 450, 460, 470, and 408 in FIG. 4 may correspond to circuits 310, 320, 330, 305, 340, 350, 360, 370, and 308 in FIG. 3A. Furthermore, circuits 410a and 410b, currents 418 and 408, $V_{in}$ 411, $V_{out}$ 412, and output 402 in FIG. 4 may correspond to circuits 310a and 310b, currents 318 and 308, $V_{in}$ 311, $V_{out}$ 312, and output 302 in FIG. 3A.

An electronic device 400 in FIG. 4 may include an amplifier circuit 410 and a linearizer 405. The electronic device 400 utilizes a single-ended, current-mode implementation. The linearizer 405 may include a signal detector circuit 440, an amplitude adjuster 450, a low pass filter (LPF) 460, a bias circuit 470, a phase shifter 480, and an LPF2 465.

The amplifier circuit 410 may include a main transistor $M_{main}$ 410a and a cascode transistor $M_{case}$ 410b. Each of $M_{main}$ 410a and $M_{case}$ 410b has a gate, a source, and a drain. The signal detector circuit 440 has a transistor $M_{case}/N$, which has a gate, a source and a drain. The amplitude adjuster 450 is a current-mirror circuit having a transistor Ma and a transistor Mb. Each of Ma and Mb has a gate, a source and a drain. The LPF 460 has a resistor and a capacitor.

The gate of $M_{main}$ 410a is configured to receive an input signal. The source of $M_{main}$ 410a is coupled to a ground, and the drain of $M_{main}$ 410a is coupled to the source of $M_{case}$ 410b. The gate of $M_{case}$ 410b is coupled to a bias voltage ($V_{case}$) and to the gate of $M_{case}/N$. The source of $M_{case}$ 410b is coupled to the source of $M_{case}/N$. The drain of $M_{case}$ 410b is coupled to an output ($V_{out}$ 412) of the amplifier circuit 410.

The drain of Ma is coupled to the drain of $M_{case}/N$, to the gate of Ma and to a first side of the resistor of the LPF 460. The source of Ma is coupled to a supply voltage ($V_{dd}$). The gate of Mb is coupled to a second side of the resistor of the LPF 460. The source of Mb is coupled to the supply voltage ($V_{dd}$), and the drain of Mb is coupled to the bias circuit 470. The bias circuit 470 is coupled to the phase shifter 480 and is configured to supply a bias current ($I_{bias}$) to the phase shifter 480.

The signal detector circuit 440 may detect the current signal flowing through the amplifier circuit 410 (or the current flowing through $M_{case}$ 410b) using $M_{case}/N$, which is an n-channel MOSFET (NMOS). In one configuration, $M_{case}$ 410b and $M_{case}/N$ are identical, except that the size of $M_{case}/N$ is N times less than the size of $M_{case}$ 410b so that the current flowing through $M_{case}/N$ is N times less than the current flowing through $M_{case}$ 410b. In one configuration, N may be between 10 and 100, between 20 and 100, or between 20 and 30 (e.g., 20). These are merely exemplary configurations, and the subject technology may utilize other configurations.

In the signal detector circuit 440, each of the gate and the source of $M_{case}/N$ may be viewed as an input of the signal detector circuit 440, and the drain of $M_{case}/N$ may be viewed as an output of the signal detector circuit 440. Each of the gate, the drain, and the source of $M_{case}$ 410b may be viewed as an output of the amplifier circuit 410. The gate of $M_{main}$ 410a may be viewed as an input of the amplifier circuit 410, and each of the drain and the source of $M_{main}$ 410a may be viewed as an output of the amplifier circuit 410. A node may be sometimes viewed as an input as well as an output of a device. For example, a node 413 may be viewed as an input as well as an output of the amplifier circuit 410. A node may be sometimes viewed as an internal node as well as an external node of a device. For example, a node 414 may be viewed as an internal node as well as an external node of the amplifier circuit 410. Accordingly, in one aspect of the disclosure, a node may be viewed as an input, an output, or both an input and an output of a device, and it may be viewed as an internal node, an external node, or both an internal node and an external node of a device.

In the amplitude adjuster 450, Ma and Mb may be two identical p-channel MOSFETs (PMOS's), except for their sizes. The current (including the AC and DC current) flowing through Ma can be mirrored to Mb, except that depending on the sizes of Ma and Mb, the current can be either increased or decreased in amplitude (or magnitude). For example, if the size of Mb is M times that of Ma, then the current (including the AC and DC current) flowing through Mb may be M times the current (including the AC and DC current) flowing through Ma. In one example, M may be between 1 and 20 (e.g., 10, 15, 20). For instance, if M is 10, then the current flowing through Mb may be 10 times the current flowing through Ma. In one aspect of the disclosure, the values N and M may be selected such that the selection does not degrade the gain or performance of the amplifier circuit 410. If N is too small (e.g., 100), the signal sampled by the signal detector circuit 440 may be too weak.

The LPF 460 may filter out the high frequencies. An input of the LPF 460 may be coupled to the gate of Ma, and an output of the LPF 460 may be coupled to the gate of Mb.

The bias circuit 470 may include the current bias circuit $I_{bias}$, and a transistor $M_{bias}$. $I_{bias}$ is coupled to the drain of Mb and the drain of $M_{bias}$. The gate of $M_{bias}$ is connected to its drain. The gate of $M_{bias}$ is also connected to an input of the phase shifter 480. The source of $M_{bias}$ is coupled to the ground. An output of the phase shifter 480 is connected to the LPF2 465, which can improve the noise figure. The output 402 of the linearizer 405 is coupled to the input of the amplifier circuit 410 to feed back the output signal of the linearizer 405 (a feedback signal from the phase shifter 480) to the amplifier circuit 410. The current bias circuit $I_{bias}$ may provide the appropriate reference bias current to $M_{bias}$ so that a bias voltage ($V_{bias}$), which is the same, or substantially the same, as the input bias voltage of the amplifier circuit ($V_{in}$ 411), can be generated at the output 402. In one example, $V_{bias}$ may be about 0.6 to 0.7 V for a 0.25 µm process or 0.4 to 0.5 V for a 65 nm process. These are merely some examples, and the subject technology is not limited to these examples.

When the amplifier circuit 410 receives an input signal having two frequencies—ω1 and ω2, the amplifier circuit 410 can generate an output signal that includes a delta frequency signal, as described above. The linearizer 405 coupled to the amplifier circuit 410 can generate an output signal that includes a signal that is the same, or substantially the same, as the delta frequency signal generated by the amplifier circuit 410, except that the amplitude and/or the phase of the signal outputted by the linearizer 405 may be different from the amplitude and/or the phase of the delta frequency signal generated by the amplifier circuit 410, and the output signal of the linearizer 405 may be biased appropriately so that the DC voltage level of the output signal of the linearizer 405 at output 402 is at the DC voltage level of the input ($V_{in}$ 411) of the amplifier circuit 410. The linearizer 405 can thus provide its output signal to the input ($V_{in}$ 411) of the amplifier circuit 410, and this can reduce the intermodulation (IM) distortion in the amplifier circuit 410.

According to one scenario of a two-tone test, two radio frequency (RF) input signals can be applied at the gate of the amplifier $M_{main}$ 410a of the amplifier circuit 410 (i.e., a common-source (CS) stage) in the signal path. Due to nonlinear behavior of the amplifier circuit (e.g., amplifier $M_{main}$ 410a), intermodulation tones (such as $2\omega1-\omega2$, $2\omega2-\omega1$, and $\omega2-\omega1$) can be generated at the drain of $M_{main}$ 410a. With the signal detector circuit 440, all intermodulation tones can be duplicated in ratio. The amplitude of the duplicate signal can be controlled by the transistor size ratio between $M_{case}$ 410b in the signal path and $M_{case}/N$ in the signal detector circuit 440. The amplitude adjuster 450 may adjust the amplitude of the duplicate signal. By applying the duplicate signal through the LPF 460, only the delta frequency ($\omega2-\omega1$) signal (or the delta frequency signal plus other signals that have frequencies lower than the delta frequency such as the DC signal) is passed. The phase of the delta frequency signal can be adjusted or controlled by the phase shifter 480. The delta frequency signal can then be injected into the gate of the CS stage 410a. By adjusting or controlling the phase and amplitude of the delta frequency signal, the amplifier linearity can be improved greatly.

It should be noted that the various blocks and circuits shown in FIGS. 3A and 4 may be arranged in different ways. For example, the LPF 360, 460 may be placed before the amplitude adjuster 350, 450, after the amplitude adjuster 350, 450, or within the amplitude adjuster 350, 450. The bias circuit 370, 470 may be placed before the phase shifter 380, 480 or after the phase shifter 380, 480. As will be shown later, a bias circuit may be placed adjacent to a signal detector circuit. Thus, a given circuit (340, 350, 360, 370, or 380) may be placed before, after, or within another circuit (340, 350, 360, 370, or 380) in whole or in part. The order of the circuits 340, 350, 360, 370, and 380 may be reversed or changed in whole or in part. The subject technology may utilize the various circuits shown in FIGS. 3A-7 and connect them in different ways.

Figure 5:
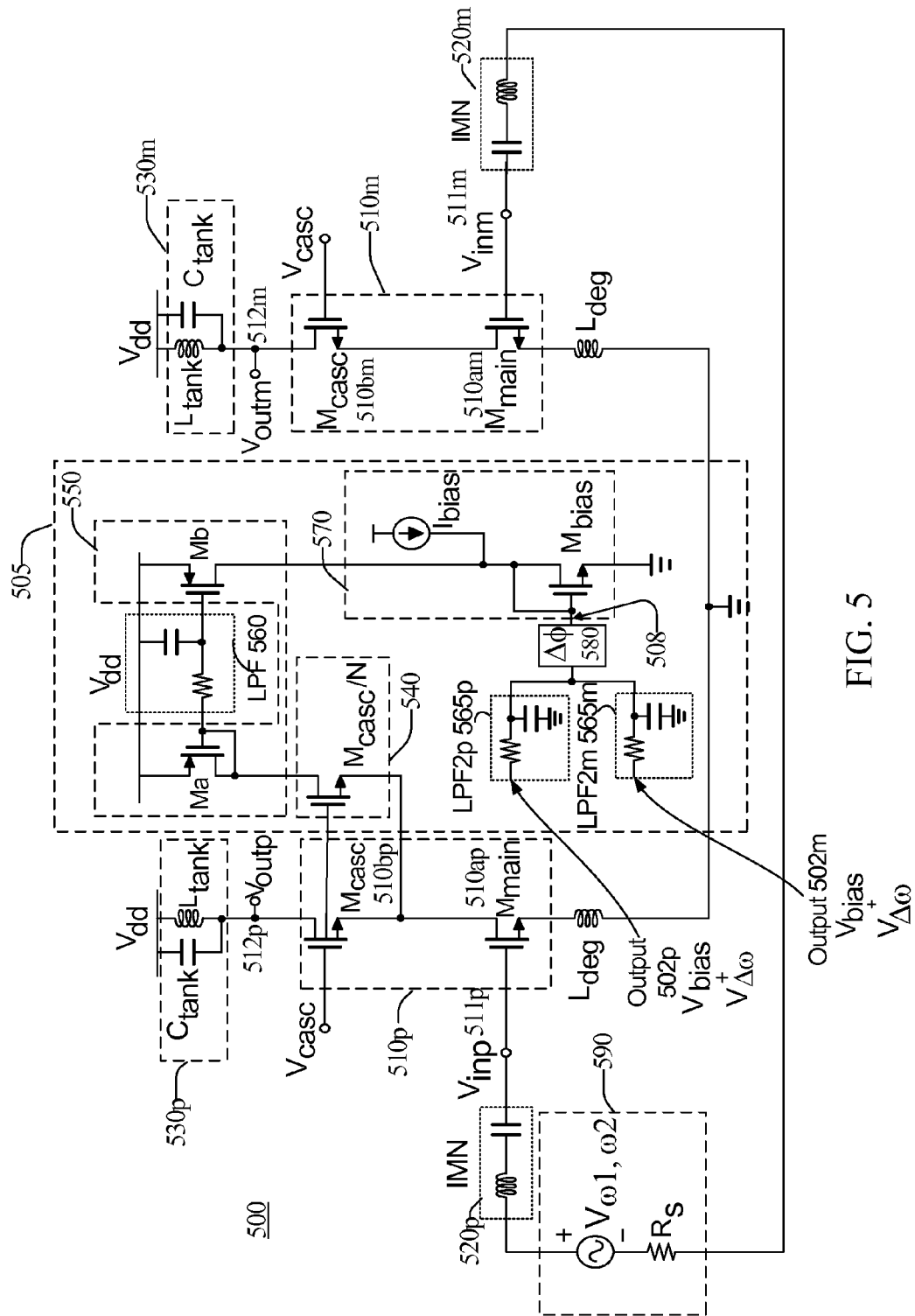
FIG. 5 is a conceptual block diagram illustrating another exemplary configuration of an electronic device utilizing a differential current-mode implementation according to one aspect of the disclosure.

FIG. 5 is a conceptual block diagram illustrating another exemplary configuration of an electronic device utilizing a differential current-mode implementation according to one aspect of the disclosure. Circuits that have functions similar to those shown in FIG. 4 have similar reference numerals in that circuits with reference numerals 5xx in FIG. 5 may correspond to circuits with reference numerals 4xx in FIG. 4 or 3xx in FIG. 3A. Reference numerals 5xxp and 5xxm together may correspond to circuits with reference numerals 4xx in FIG. 4 or 3xx in FIG. 3A. The notations p and m indicate a differential mode. For example, circuits 510, 520, 530, 505, 540, 550, 560, 570, and 508 in FIG. 5 may correspond to circuits 410, 420, 430, 405, 440, 450, 460, 470, and 408 in FIG. 4 or circuits 310, 320, 330, 305, 340, 350, 360, 370, and 308 in FIG. 3A. Furthermore, a pair of $V_{inp}$ 511p and $V_{inm}$ 511m, a pair of $V_{outp}$ 512p and $V_{outm}$ 512m, and a pair of outputs 502p and 502m in FIG. 5 may be considered to correspond to $V_{in}$ 411, $V_{out}$ 412, and output 402 in FIG. 4, or $V_{in}$ 311, $V_{out}$ 312, and output 302 in FIG. 3A.

In FIG. 5, an electronic device 500 includes components similar to those shown in FIG. 4 and operates in a similar manner, except that the electronic device 500 utilizes a differential current-mode implementation. For example, a differential amplifier circuit includes two amplifier blocks 510p and 510m. An IMN also includes two blocks 520p and 520m. A tank circuit includes two blocks 530p and 530m. A linearizer 505 in FIG. 5 may be similar to the linearizer 405 in FIG. 4. While the circuit blocks shown in FIGS. 4 and 5 may be similar, the actual transistors utilized (e.g., device size, oxide thickness, the number of transistors utilized, the transistor connections, and the circuit layout) may be different, and FIG. 4 is for a single-ended mode, and FIG. 5 is for a differential mode. Outputs 502p and 502m of the linearizer 505 in FIG. 5 may be coupled to the differential inputs of the amplifier circuit 510p and 510m (i.e., $V_{inp}$ 511p and $V_{inm}$ 511m), respectively. An input of the linearizer 505 in FIG. 5 may be coupled to one of the blocks (e.g., 510p) of the amplifier circuit 510p and 510m.

The electronic device 500 may include an amplifier circuit 510p and 510m and a linearizer 505. The linearizer 505 may include a signal detector circuit 540, an amplitude adjuster 550, a low pass filer (LPF) 560, a bias circuit 570, a phase shifter 580, an LPF2p 565p, and an LPF2m 565m.

The amplifier circuit 510p and 510m may include a transistor $M_{main}$ 510ap, a cascode transistor $M_{case}$ 510bp, a transistor $M_{main}$ 510am, and a cascode transistor $M_{case}$ 510bm. Each of $M_{main}$ 510ap, $M_{main}$ 510am, $M_{case}$ 510bp and $M_{case}$ 510bm has a gate, a source and a drain. The signal detector circuit 540 may include a transistor $M_{case}/N$, which has a gate, a source and a drain. The amplitude adjuster 550 is a current-mirror circuit having a transistor Ma and a transistor Mb. Each of Ma and Mb has a gate, a source and a drain. The LPF 560 has a resistor and a capacitor.

The gate of $M_{main}$ 510ap is configured to receive an input signal. The source of $M_{main}$ 510ap is coupled to the ground, and the drain of $M_{main}$ 510ap is coupled to the source of $M_{case}$ 510bp. The gate of $M_{case}$ 510bp is coupled to a bias voltage ($V_{case}$) and to the gate of $M_{case}/N$. The source of $M_{case}$ 510bp is coupled to the source of $M_{case}/N$. The drain of $M_{case}$ 510bp is coupled to an output ($V_{out}$ 512p) of the amplifier circuit block 510p.

The gate of $M_{main}$ 510am is configured to receive an input signal that is 180° out of phase of the input signal supplied to the gate of $M_{main}$ 510ap. The source of $M_{main}$ 510am is coupled to the ground, and the drain of $M_{main}$ 510am is coupled to the source of $M_{case}$ 510bm. The gate of $M_{case}$ 510bm is coupled to a bias voltage ($V_{case}$). The drain of $M_{case}$ 501bm is coupled to an output ($V_{out}$ 512m) of the amplifier circuit block 510m.

The drain of Ma is coupled to the drain of $M_{case}/N$, to the gate of Ma and to a first side of the resistor of the LPF 560. The source of Ma is coupled to a supply voltage ($V_{dd}$). The gate of Mb is coupled to a second side of the resistor of the LPF 560. The source of Mb is coupled to the supply voltage ($V_{dd}$), and the drain of Mb is coupled to the bias circuit 570. The bias circuit 570 is coupled to the phase shifter 580 and is configured to supply a bias current ($I_{bias}$) to the phase shifter 580. The output signal (a feedback signal) of the phase shifter 580 can be provided to the differential inputs ($V_{inp}$ 511p and $V_{inm}$ 511m) of the amplifier circuit 510p and 510m via the LPF2p 565p and the LPF2m 565m, respectively.

Figure 6:
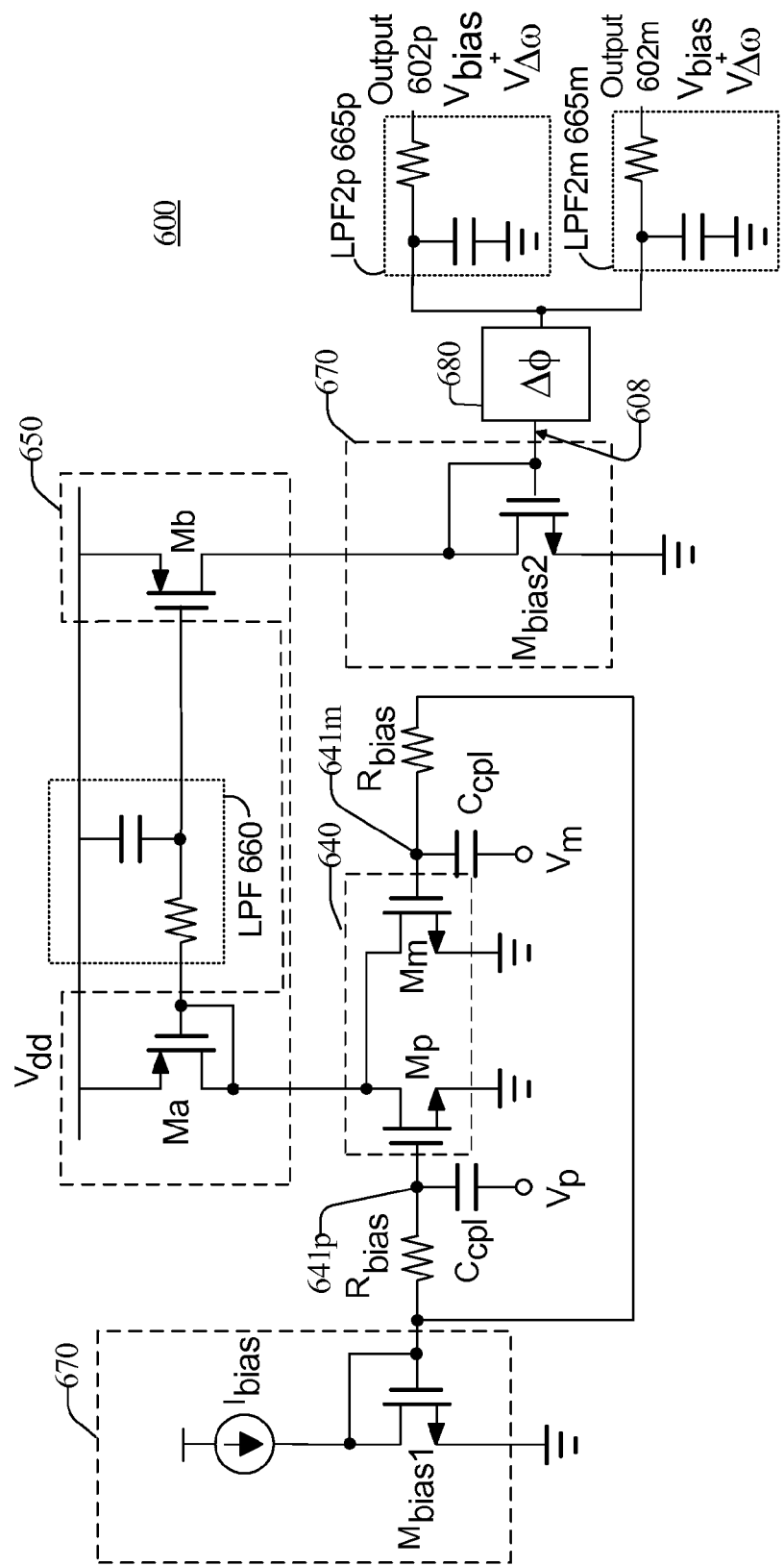
FIG. 6 is a conceptual block diagram illustrating an exemplary configuration of a linearizer utilizing a voltage mode according to one aspect of the disclosure.
Figure 7:
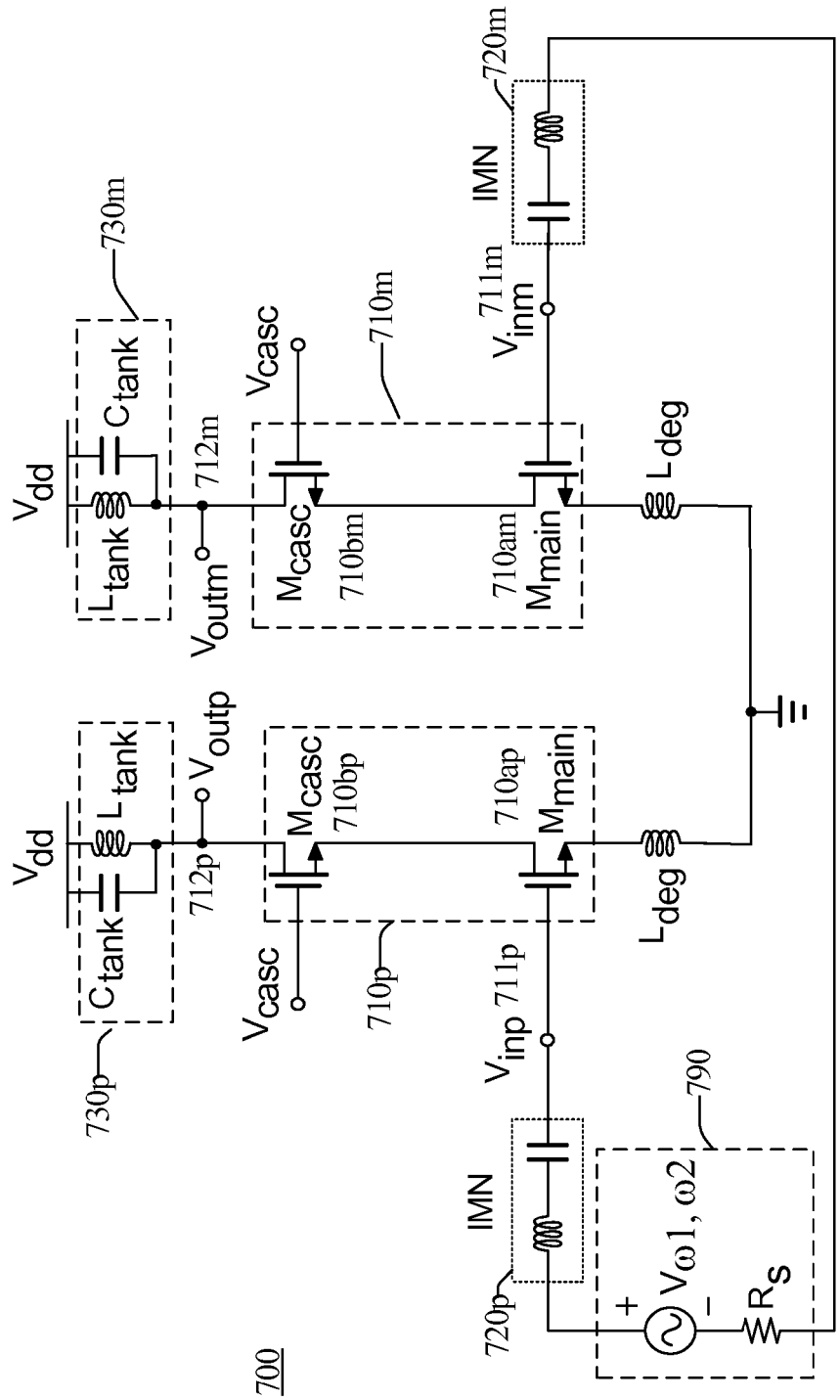
FIG. 7 is a conceptual block diagram illustrating an exemplary configuration of an amplifier circuit utilizing a differential mode according to one aspect of the disclosure.

FIG. 6 is a conceptual block diagram illustrating an exemplary configuration of a linearizer utilizing a voltage-mode implementation according to one aspect of the disclosure. FIG. 7 is a conceptual block diagram illustrating an exemplary configuration of an amplifier circuit utilizing a differential mode according to one aspect of the disclosure. A linearizer 600 in FIG. 6 may be used in conjunction with an amplifier circuit 700 in FIG. 7. Circuits in FIGS. 6 and 7 that have functions similar to those shown in FIG. 5 or FIG. 3A have similar reference numerals in that circuits with reference numerals 6xx in FIGS. 6 and 7xx in FIG. 7 may correspond to circuits with reference numerals 5xx in FIG. 5 or 3xx in FIG. 3A. Reference numerals 6xxp and 6xxm together as shown in FIGS. 6 and 7xxp and 7xxm together as shown in FIG. 7 may correspond to circuits with reference numerals 5xxp and 5xxm in FIG. 5 or 3xx in FIG. 3A. The notations p and m indicate a differential mode.

For example, circuits 640, 650, 660, 670, and 608 in FIG. 6 may correspond to circuits 540, 550, 560, 570, and 508 in FIG. 5 or circuits 340, 350, 360, 370, and 308 in FIG. 3A. Circuits 710p/710m, 720p/720m, 730p/730m in FIG. 7 may correspond to circuits 510p/510m, 520p/520m, 530p/530m in FIG. 5 or circuits 310, 320 and 330 in FIG. 3A. Furthermore, outputs 602p and 602m in FIG. 6 may be considered to correspond to outputs 502p and 502m in FIG. 5, respectively, or output 302 in FIG. 3A. A pair of $V_{inp}$ 711p and $V_{inm}$ 711m and a pair of $V_{outp}$ 712p and $V_{outm}$ 712m in FIG. 7 may correspond to a pair of $V_{inp}$ 511p and $V_{inm}$ 511m and a pair of $V_{outp}$ 512p and $V_{outm}$ 512m in FIG. 5, or $V_{in}$ 311 and $V_{out}$ 312 in FIG. 3A.

Referring to FIG. 7, an amplifier circuit 710p and 710m may include a transistor $M_{main}$ 710ap, a cascode transistor $M_{case}$ 710bp, a transistor $M_{main}$ 710am, and a casecode transistor $M_{case}$ 710bm. Each of $M_{main}$ 710ap, $M_{main}$ 710am, $M_{case}$ 710bp and $M_{case}$ 710bm has a gate, a source and a drain.

The gate of $M_{main}$ 710ap is configured to received an input signal. The source of $M_{main}$ 710ap is coupled to the ground, and the drain of $M_{main}$ 710ap is coupled to the source of $M_{case}$ 710bp. The gate of $M_{case}$ 710bp is coupled to a bias voltage ($V_{case}$). The drain of $M_{case}$ 710bp is coupled to an output ($V_{out}$ 712p) of the amplifier circuit block 710p.

The gate of $M_{main}$ 710am is configured to receive an input signal that is 180° out of phase of the input signal supplied to the gate of $M_{main}$ 710ap. The source of $M_{main}$ 710am is coupled to the ground, and the drain of $M_{main}$ 710am is coupled to the source of $M_{case}$ 710bm. The gate of $M_{case}$ 710bm is coupled to the bias voltage ($V_{case}$). The drain of $M_{case}$ 710bm is coupled to an output ($V_{out}$ 712m) of the amplifier circuit block 710m.

Now referring to FIG. 6, a linearizer 600 may include a signal detector circuit 640, an amplitude adjuster 650, an LPF 660, a bias circuit 670, a phase shifter 680, an LPF2p 665p and an LPF2m 665m. The signal detector circuit 640 may include a differential pair of transistors such as n-channel MOSFETs $M_p$ and $M_m$, each of which has a gate, a source and a drain. The amplitude adjuster 650 may be a current-mirror circuit having a transistor Ma and a transistor Mb. Each of Ma and Mb has a gate, a source and a drain. The LPF 660 has a resistor and a capacitor.

The gate of $M_p$ is coupled to a node $V_p$ via an AC coupling capacitance $C_{cpl}$. The gate of $M_m$ is coupled to a node $V_m$ via another AC coupling capacitance $C_{cpl}$. The gate of $M_p$ and the gate of $M_m$ are coupled to the bias circuit 670 via its respective resistor ($R_{bias}$). The source of $M_p$ and the source of $M_m$ are coupled to the ground. The drain of $M_p$ is coupled to the drain of $M_m$. Each $R_{bias}$ at node 641p and at node 641m is configured to provide the appropriate bias voltage at nodes 641p and 641m.

Nodes $V_p$ and $V_m$ in FIG. 6 may be coupled to $V_{inp}$ 711p and $V_{inm}$ 711m, respectively, or coupled to $V_{outp}$ 712p and $V_{outm}$ 712m, respectively, in FIG. 7. In other words, the gate of $M_p$ and the gate of $M_m$ may be coupled to the gate of $M_{main}$ 710ap and the gate of $M_{main}$ 710am, respectively, or coupled to $V_{outp}$ 712p and $V_{outm}$ 712m, respectively. Thus, the first and second inputs of the linearizer 600 may be coupled to the first and second inputs of the amplifier circuit 700, respectively, or coupled to the first and second outputs of the amplifier circuit 700, respectively.

Referring to FIGS. 6 and 7, if the gate of $M_p$ and the gate of $M_m$ are coupled to the gate of $M_{main}$ 710ap and the gate of $M_{main}$ 710am, respectively, then the bias circuit 670 may provide a bias current or a bias voltage to the gate of $M_p$ and the gate of $M_m$ so that the gate of $M_p$ is at the DC voltage level of the gate of $M_{main}$ 710ap, and the gate of $M_m$ is at the DC voltage level of the gate of $M_{main}$ 710am. If the gate of $M_p$ and the gate of $M_m$ are coupled to $V_{outp}$ 712p and $V_{outm}$ 712m, respectively, then the bias circuit 670 may provide a bias current or a bias voltage to the gate of $M_p$ and the gate of $M_m$ so that the gate of $M_p$ is at the DC voltage level of the gate of $M_{main}$ 710ap, and the gate of $M_m$ is at the DC voltage level of the gate of $M_{main}$ 710am.

The drain of Ma is coupled to the drain of $M_p$, to the drain of $M_m$, to the gate of Ma and to a first side of the resistor of the LPF 660. The source of Ma is coupled to the supply voltage ($V_{dd}$). The gate of Mb is coupled to a second side of the resistor of the LPF 660. The source of Mb is coupled to the supply voltage ($V_{dd}$), and the drain of Mb is coupled to the bias circuit 670. The bias circuit 670 is coupled to the phase shifter 680 and is configured to supply a bias current ($I_{bias}$) to the phase shifter 680 and to the signal detector circuit 640. The output signal (a feedback signal) of the phase shifter 680 can be provided to the differential inputs ($V_{inp}$ 711p and $V_{inm}$ 711m) of the amplifier circuit 710p and 710m via the LPF2p 665p and the LPF2m 665m, respectively.

In operation, the input of the signal detector circuit 640 in FIG. 6 (or particularly, the gate of $M_p$ and the gate of $M_m$) can detect and receive the AC voltage signal of the amplifier circuit 700 in FIG. 7 (either the AC input voltage signal at $V_{inp}$ 711p and $V_{inm}$ 711m or the AC output voltage signal at $V_{outp}$ 712p and $V_{outm}$ 712m). The signal detector circuit 640 in FIG. 6 can eliminate the odd order harmonics (or odd order frequencies) and pass the even order harmonics (or even order frequencies) in the AC voltage signal received from the amplifier circuit 700. In this example, this can be accomplished by having a common drain in the signal detector circuit 640 (e.g., the drain of $M_p$ is connected to the drain of $M_m$).

An output signal of the signal detector circuit 640 may be amplitude adjusted, phase adjusted, and filtered in a manner similar to that described with reference to FIGS. 3A, 4 and 5 above. The current-mirror circuit 650 may increase or decrease the amplitude of the output signal of the signal detector circuit 640 or the signal from the amplifier circuit 700. The LPF 660 may eliminate the high frequencies in the signal (e.g., frequencies greater than the delta frequency). The bias circuit 670 may provide the appropriate DC bias current so that the DC output signals at the outputs 602p and 602m may be the same, or substantially the same, as the DC input voltage at the inputs $V_{inp}$ 711p and $V_{inm}$ 711m of the amplifier circuit 700, respectively. The phase shifter 680 may adjust the phase of its input signal and produce its output signal, which contains a signal that corresponds to the delta frequency signal generated by the amplifier circuit 700 with possibly the amplitude and/or the phase adjusted. The current 608 flowing into the phase shifter 680 in FIG. 6 may be much less (e.g., 20 to 30 times less) than the current flowing through the amplifier circuit 710p and 710m in FIG. 7.

In FIG. 7, the cascode transistor $M_{case}$ 710bp and $M_{case}$ 710bm may be eliminated according to one configuration of the disclosure. In that exemplary configuration, an amplifier circuit 710p/710m may include the main transistors $M_{main}$ 710ap and $M_{main}$ 710am but does not include the cascode transistor $M_{case}$ 710bp or $M_{case}$ 710bm.

Figure 8:
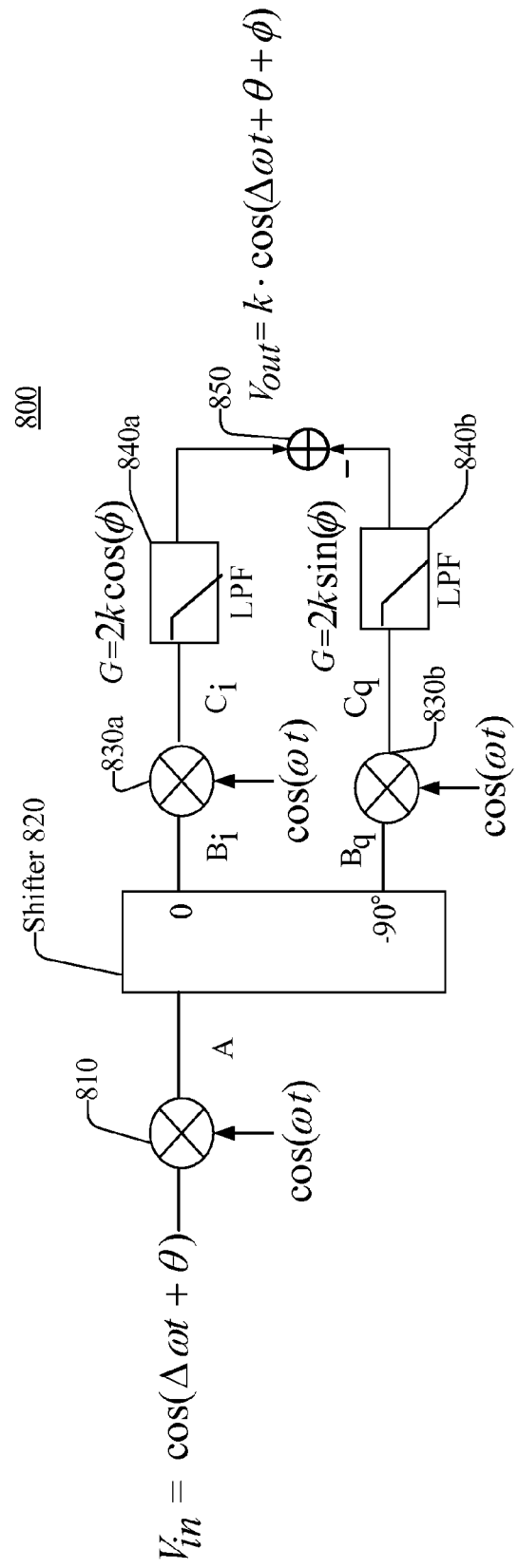
FIG. 8 is a conceptual block diagram illustrating an exemplary configuration of a phase shifter according to one aspect of the disclosure.

FIG. 8 is a conceptual block diagram illustrating an exemplary configuration of a phase shifter according to one aspect of the disclosure. A phase shifter 800 in FIG. 8 may include a mixer 810 coupled to a shifter 820, which may be a poly phase shifter. The shifter 820 may have two outputs (a 0° output and a 90° output), which may be coupled to their corresponding mixers 830a and 830b. The mixers 830a and 830b may be coupled to their corresponding low pass filters (LPFs) 840a and 840b. The outputs of the LPFs 840a and 840b may be coupled to, and combined by, an adder 850. The phase shifter 800 thus provides dual parallel signal paths (e.g., a first path including the first output of the shifter 820, the mixer 830a, the LPF 840a, and the first input of the adder 850, and a second parallel path including the second output of the shifter 820, the mixer 830b, the LPF 840b, and the second input of the adder 850).

The phase shifter 800 (e.g., the mixer 810) may receive an input signal $V_{in}=\cos(\Delta\omega t+\theta)$, and the phase shifter 800 (e.g., the adder 850) may produce an output signal $V_{out}=k\cdot\cos(\Delta\omega t+\theta+\phi)$. The term k may represent a gain of the phase shifter 800, and the term $\phi$ may represent an output phase shift compared to the input of the phase shifter 800. According to one aspect, no special requirement is imposed on $\omega$, except that $\omega$ is generally much larger than $\Delta\omega$ (e.g., 20 times).

The terms A, $B_i$, $B_q$, $C_i$, $C_q$ and $V_{out}$ shown in FIG. 8 may be expressed as follows:

$$A = \cos(\Delta\omega t + \theta)\cos(\omega t)$$

$$B_i = \cos(\Delta\omega t + \theta)\cos(\omega t) = 0.5(\cos(\Delta\omega t + \theta - \omega t) + \cos(\Delta\omega t + \theta + \omega t))$$

$$B_q = 0.5(\cos(\Delta\omega t + \theta - \omega t - \pi/2) + \cos(\Delta\omega t + \theta + \omega t - \pi/2)) =$$

$$0.5(\sin(\Delta\omega t + \theta - \omega t) + \sin(\Delta\omega t + \theta + \omega t))$$

$$C_i = 0.5\cos(\Delta\omega t + \theta)\{\text{ignoring high frequency term}\}$$

$$C_q = 0.5(\sin(\Delta\omega t + \theta - \omega t) + \sin(\Delta\omega t + \theta + \omega t))\cos(\omega t)$$

$$= 0.25(\sin(\Delta\omega t + \theta - 2\omega t) + \sin(\Delta\omega t + \theta) + \sin(\Delta\omega t + \theta) + \sin(\Delta\omega t + \theta + 2\omega t))$$

$$= 0.5\sin(\Delta\omega t + \theta)\{\text{ignoring high frequency term}\}$$

$$V_{out} = \cos(\Delta\omega t + \theta)k \cos(\phi) - \sin(\Delta\omega t + \theta)k \sin(\phi)$$

$$= k \cdot \cos(\Delta\omega t + \theta + \phi)$$

The phase shifter 800 utilizes a dual-conversion method in which the phase shift is constant with respect to frequency. The phase shift can be any amount between 0° and 360°. The phase shifter 800 is advantageous over a filter based phase shifter. For modulated signals, a filter based phase shift is nonlinear over frequency and thus is not desirable for distortion compensation. The phase shifter 800 shown in FIG. 8 may be implemented in any of FIGS. 3A, 4, 5, and 6.

Figure 9:
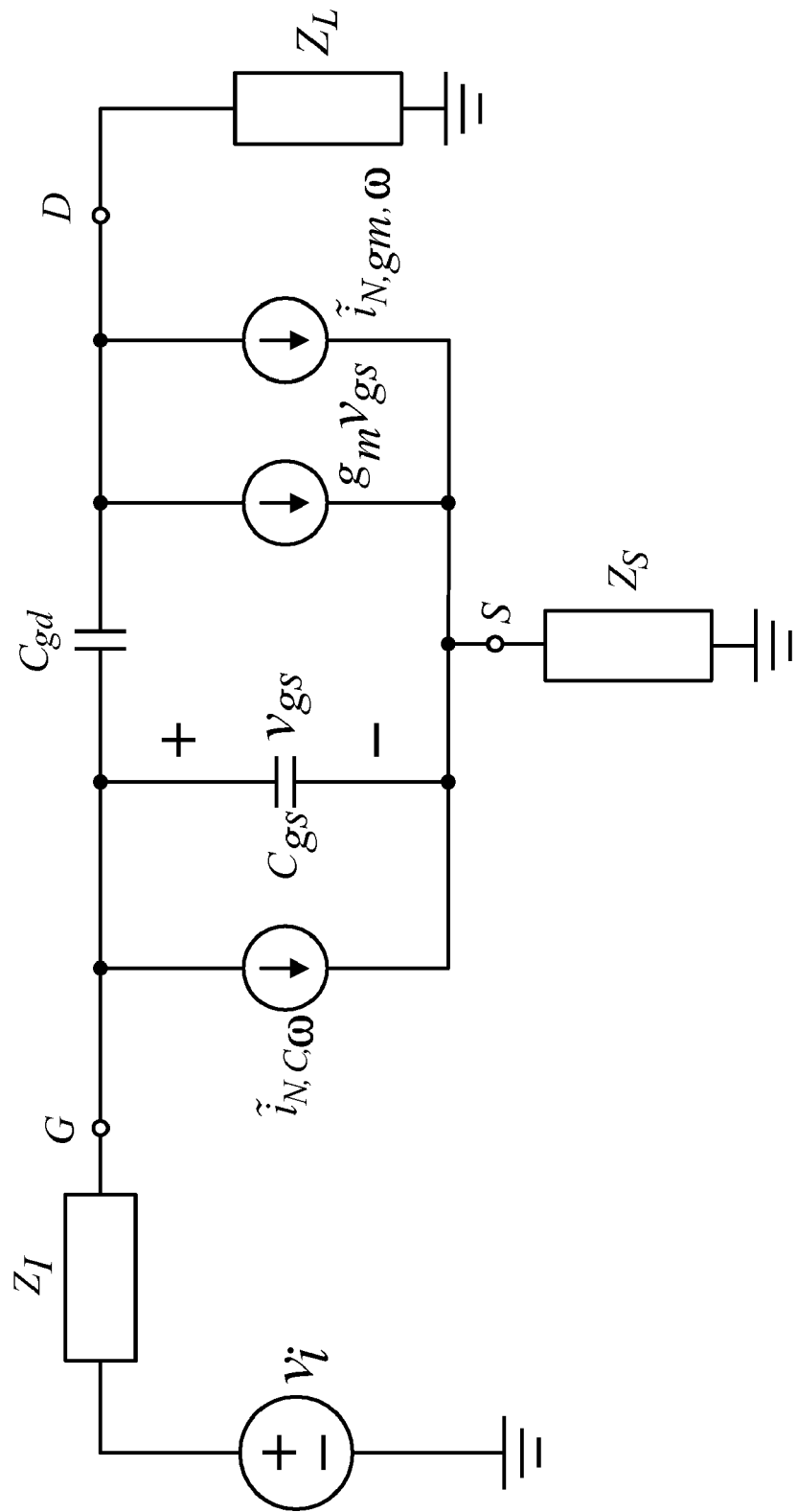
FIG. 9 is a conceptual block diagram illustrating an example of a nonlinear amplifier model.

FIG. 9 is a conceptual block diagram illustrating an example of a nonlinear amplifier model. Assuming a two-tone sinusoidal input at frequencies $\omega_1$ and $\omega_2$, a delta frequency signal can be expressed as $$i_{env}(t)=I_{env}\cos[(\omega_2-\omega_1)t+\theta_{env}] \quad (1)$$

where $I_{env}$ and $\theta_{env}$ denote the amplitude and the phase of the delta frequency signal, respectively. A delta frequency signal is sometimes referred to as an envelop signal. For intermodulation calculations, this is modeled as an additional small-signal envelope signal voltage along with the two-tone RF input signals.

Volterra analysis described below is used to capture the frequency dependent nonlinearities, which is caused by circuit memory effects. The equivalent nonlinear circuit is shown in FIG. 9, where $Z_I$, $Z_S$, and $Z_L$ denote the input, source, and load impedances, respectively. In this model, capacitance $C_{gs}$ and trans-conductance $g_m$ are assumed to be the only nonlinear elements.

The nonlinear model is based on the nonlinear current Volterra analysis. The fundamental signals are found by setting the nonlinear current sources to zero, while higher-order distortion voltages are evaluated by setting the signal source to zero.

The i-v relationship of $C_{gs}$ can be given by $$i = \frac{d}{dt}[C_{gs}v_{gs} + K_{2C}v_{gs}^2 + K_{3C}v_{gs}^3] \quad (2)$$

where $K_{2C}$ and $K_{3C}$ are the $2^{nd}$- and $3^{rd}$-order nonlinear capacitance coefficients, and $v_{gs}$ is the gate-source voltage. Similarly, the nonlinear collector current is given by $$i_d = g_m v_{gs} + K_{2gm}v_{gs}^2 + K_{3gm}v_{gs}^3 \quad (3)$$

where $K_{2gm}$ and $K_{3gm}$ are the $2^{nd}$- and $3^{rd}$-order nonlinear transconductance coefficients. These coefficients are extracted from simulations of the n-channel MOSFET (NMOS) transistor biased in the actual operating conditions. The nonlinear current sources $\tilde{i}_{N,C,\omega}$ and $\tilde{i}_{N,gm,\omega}$ denote the $N^{th}$-order nonlinear capacitance and transconductance currents at frequency $\omega$, which are calculated based on the nonlinear current method.

There are three input tones at the gate of the transistor, in which two input frequencies are at $\omega_1$, and $\omega_2$, and the third (envelope) signal input is at $\omega_3=\int\omega_2-\omega_1$. The resulting distortion can be derived using a method of nonlinear currents. From FIG. 9, by ignoring the nonlinear current sources, the fundamental drain and gate-source voltages (at $\omega$) can be given by:

$$v_d(\omega) = \frac{[-g_m + j\omega C_{gd}(1 + g_m Z_S) - \omega^2 C_{gs}C_{gd}Z_S]Z_L}{D(\omega)}v_i(\omega) \quad (4)$$

$$v_{gs}(\omega) = \frac{1 + j\omega C_{gd}Z_L}{D(\omega)}v_i(\omega) \quad (5)$$

where $D(\omega)$ is given as:

$$D(\omega)=1-\omega^2(C_{gs}C_{gd}Z_S Z_L+C_{gs}C_{gd}Z_S Z_I+C_{gs}C_{gd}Z_L Z_I)$$

$$+g_m Z_S+j\omega[C_{gs}Z_S+C_{gd}Z_L+C_{gs}Z_I+C_{gd}Z_I$$

$$+C_{gd}g_m(Z_S Z_L+Z_S Z_I+Z_L Z_I)] \quad (6)$$

The $2^{nd}$-order gate-source voltage at frequency $\omega$ is found to be $$v_{gs}(\omega)=-\{\tilde{i}_{2,gm,\omega}[Z_S+j\omega C_{gd}(Z_L Z_I+Z_S Z_L+Z_I Z_S)]$$

$$+\tilde{i}_{2,C,\omega}[Z_I+Z_S+j\omega C_{gd}(Z_L Z_I+Z_S Z_L+Z_I Z_S)]\}/D(\omega) \quad (7)$$

For double frequency terms (such as $2\omega_1$), the nonlinear currents can be given by $$\tilde{i}_{2,gm,2\omega} = \frac{K_{2gm}}{2}v_{gs}^2(\omega) \tag{8}$$

$$\tilde{i}_{2,C,2\omega} = K_{2C}j\omega v_{gs}^2(\omega)$$

Similarly, for difference frequency terms (such as $\omega_2-\omega_1$), the nonlinear currents can be given by $$\tilde{i}_{2,gm,\omega_a-\omega_b} = K_{2gm}v_{gs}(-\omega_b)v_{gs}(\omega_a)$$

$$\tilde{i}_{2,C,\omega_a-\omega_b} = K_{2C}j(\omega_a-\omega_b)v_{gs}(-\omega_b)v_{gs}(\omega_a) \tag{9}$$

The $3^{rd}$-order drain voltages can be written as:

$$v_d(\omega) = Z_L\{-\tilde{i}_{3,C,\omega}[-j\omega C_{gd}Z_I + g_m(Z_S+Z_I)]$$

$$-\tilde{i}_{3,gm,\omega}[1+j\omega C_{gd}Z_I + j\omega C_{gs}(Z_S+Z_I)]\}/D(\omega) \tag{10}$$

The third-order intermodulation distortion (IMD$_3$) currents can be given by:

$$\tilde{i}_{3,gm,2\omega_a-\omega_b} = K_{2gm}[① + ② + ③ + ④] + \frac{3K_{3gm}}{4}[⑤ + ⑥] \tag{11}$$

$$\tilde{i}_{3,C,2\omega_a-\omega_b} =$$
$$j(2\omega_a - \omega_b)\left\{K_{2C}[① + ② + ③ + ④] + \frac{3K_{3C}}{4}[⑤ + ⑥]\right\}$$

where ①-⑥ denote all possible combinations of the lower-order (fundamental and $2^{nd}$ order) terms that contribute to the IMD$_3$ products. Specifically, for IMD$_3$ at $2\omega_1-\omega_2$, these six terms are:

$$① = v_{gs}(2\omega_1)v_{gs}(-\omega_2) \quad ② = v_{gs}(\omega_2)v_{gs}(-2\omega_3) \tag{12}$$
$$③ = v_{gs}(\omega_1)v_{gs}(\omega_1-\omega_2) \quad ④ = v_{gs}(\omega_1)v_{gs}(-\omega_3)$$
$$⑤ = v_{gs}(-\omega_2)v_{gs}^2(\omega_1) \quad ⑥ = v_{gs}(\omega_2)v_{gs}^2(-\omega_3)$$

By the same token, the corresponding products for the IMD$_3$ at $2\omega_2-\omega_1$ are $$[1] = v_{gs}(-\omega_1)v_{gs}(2\omega_2) \quad [2] = v_{gs}(\omega_1)v_{gs}(2\omega_3) \tag{13}$$
$$[3] = v_{gs}(\omega_2)v_{gs}(\omega_2-\omega_1) \quad [4] = v_{gs}(\omega_2)v_{gs}(\omega_3)$$
$$[5] = v_{gs}(-\omega_1)v_{gs}^2(\omega_2) \quad [6] = v_{gs}(\omega_1)v_{gs}^2(\omega_3)$$

Finally, the $3^{rd}$-order intermodulation ratio (IMR$_3$) can be determined by the ratio between the fundamental and the third-order $v_d$ given by (4) and (10).

Notice that the products denoted by ①③⑤ are the conventional IMD$_3$ components, as they are envelope signal ($\omega_3$) independent. Among the remaining envelope-dependent terms, only ④ is of interest as the other two (②⑥) involve "squaring" the already small envelope input, and can be safely ignored.

Figure 10A:
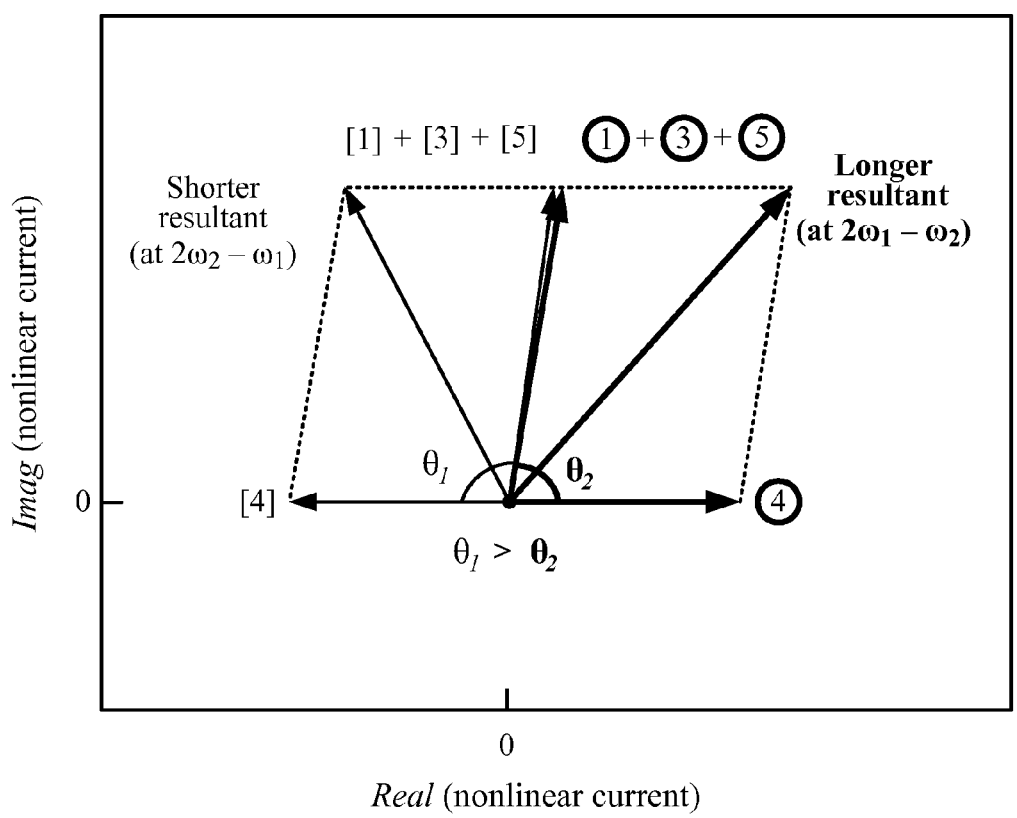
FIG. 10A is a conceptual diagram illustrating an example of a vector diagram for asymmetrical nonlinearity.

Since the envelope-dependent mixing products ④ and [4] will typically have different phase relationships with the conventional distortion components, their summation can result in unequal IMD$_3$ amplitudes at $2\omega_1-\omega_2$ and $2\omega_2-\omega_1$. This scenario is graphically demonstrated in FIG. 10A, where the nonlinear current components are represented by vectors to highlight their interactions. In this example, the angle between vectors [4] and $\Sigma[[1][3][5]]$ is greater than that between ④ and $\Sigma[①③⑤]$ (i.e., $\theta_1>\theta_2$). As a result, their resultant vectors exhibit different magnitudes. So, the IMD$_3$ at $2\omega_2-\omega_1$ will be lower than that at $2\omega_1-\omega_2$. It shows that asymmetric spectral regrowth is possible although the individual distortion components are equal in magnitude at both frequencies.

The vector diagram also points to the fact that if the injected envelope signal is too strong, vectors ④ and [4] will dominate the final IMD$_3$ resultant vector, which is highly undesirable.

Figure 10B:
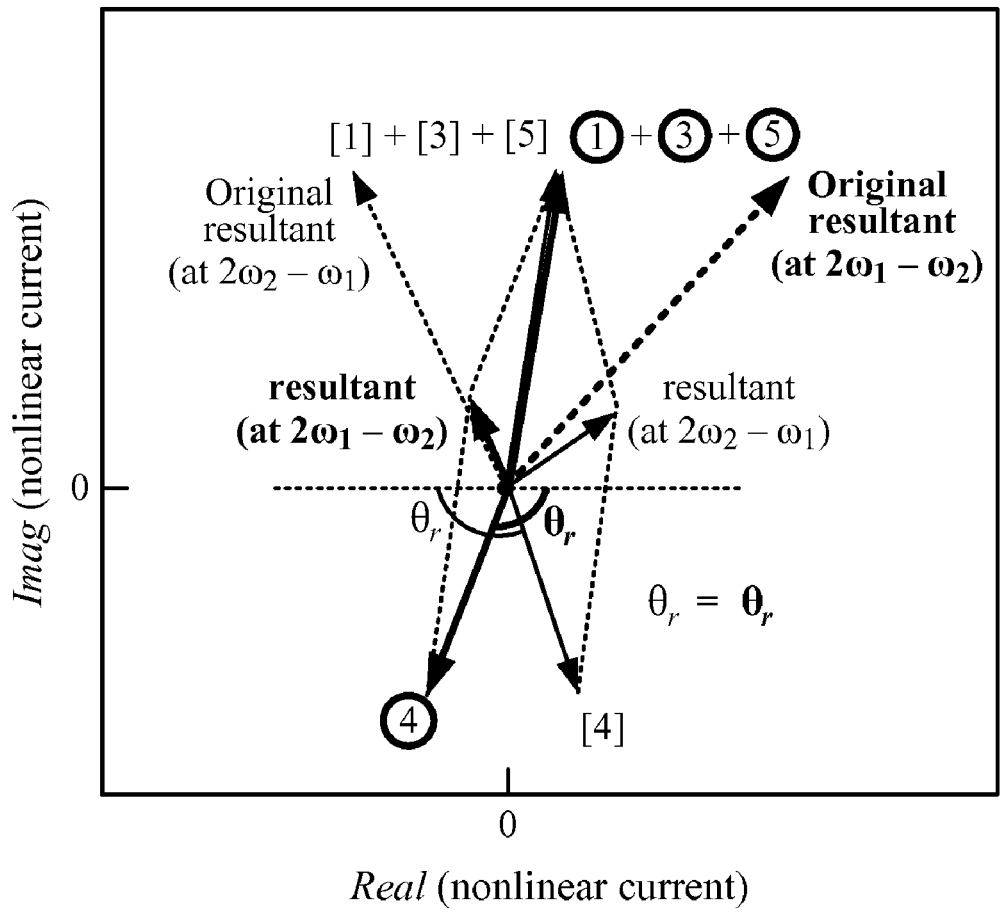
FIG. 10B is a conceptual diagram illustrating an example of a vector diagram for delta frequency injection linearization.

The above theoretical analysis also leads to a linearization method for amplifiers by controlling the injected delta frequency signal $\omega_3$. As shown in FIG. 10B, a phase shift (with respect to the input RF signals) is introduced to the envelope signal when it is injected back to an amplifier circuit (e.g., 310 in FIG. 3A, 410 in FIG. 4, 510p/510m in FIG. 5, or 710p/710m in FIG. 7). Then vectors ④ and [4] rotate in opposite direction by the same angle $\theta_r$. As a result, both envelope-dependent nonlinear current vectors move to align themselves opposite to the fixed IMD$_3$ components (the vectors of $\Sigma[①③⑤]$ and $\Sigma[[1][3][5]]$). The resultant IMD$_3$ vectors at both $2\omega_1-\omega_2$ and $2\omega_2-\omega_1$ frequencies are substantially reduced simultaneously.

Since the envelope detector (e.g., 340 in FIG. 3A, 440 in FIG. 4, 540 in FIG. 5, and 640 in FIG. 6) and phase shifter circuits (e.g., 380 in FIG. 3A, 480 in FIG. 4, 580 in FIG. 5, and 680 in FIG. 6) are very low-power and low-cost, there is not much extra penalty for this linearization technique in wireless applications.

Figure 11B:
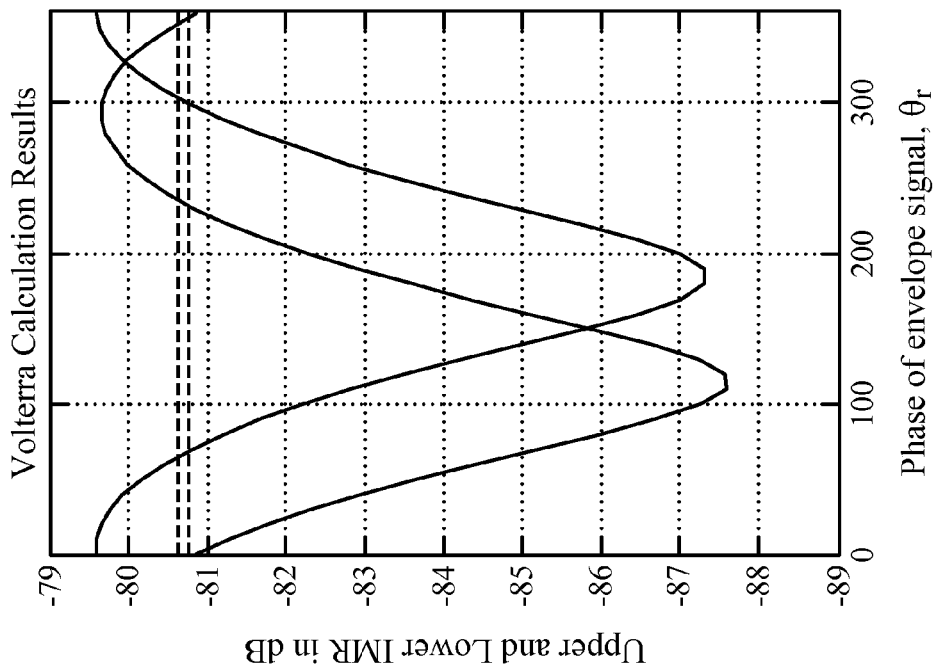
FIG. 11B illustrates an exemplary spectra calculation results according to one aspect of the disclosure.
Figure 11A:
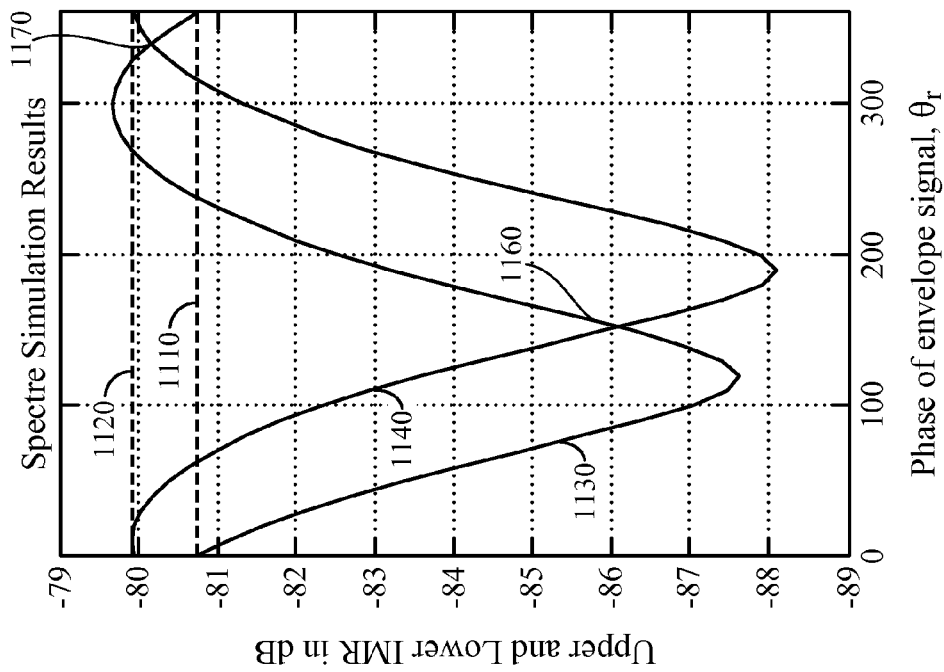
FIG. 11A illustrates an exemplary spectra simulation results according to one aspect of the disclosure.

FIG. 11A illustrates an exemplary spectra simulation results according to one aspect of the disclosure. FIG. 11B illustrates an exemplary spectra calculation results according to one aspect of the disclosure. Both the simulation and calculation results show a significant reduction in intermodulation distortion. In FIG. 11A, a line 1110 illustrates an upper IMD without using a method described herein. A line 1120 illustrates a lower IMD without using a method described herein. A curve 1130 illustrates an upper IMD with a correction made using a method described herein. A curve 1140 illustrates a lower IMD with a correction made using a method described herein. The angle $\theta_r$ (or the phase of the envelop signal) can be selected so that both the upper IMR and the lower IMR are good. The angle $\theta_r$ can be an intercept point of the two curves 1130 and 1140. If there are two intercept points (e.g., 1160 and 1170 as shown in this example), then the lowest intercept point may be selected (e.g., intercept point 1160 in this example). In this example, the intercept point 1160 is at about 140-150. Thus, the angle $\theta_r$ (the phase of the envelop signal) is about 140-150° in this example. These are merely examples, and the subject technology is not limited to these examples.

According to one aspect of the disclosure, this method has, among others, the following advantages: A delta frequency signal may be generated using circuitry that is on an integrated circuit chip utilized for other purposes. As a result, the method can save cost. In addition, on the system side, the method can help remove the inter-stage SAW filter, such as the SAW filter 220 in FIG. 1, in a cellular code division multiple access (CDMA) receiver system. Furthermore, the method can be combined with other linearization techniques to achieve even better performance. Moreover, the method can be used to increase the linearity of an amplifier circuit in a transmitter. In addition, the subject technology may be utilized to improve linearity of other types of amplifiers or amplifier circuits. The subject technology is thus not limited to a receiver or a transmitter, or an amplifier in a receiver or a transmitter. The subject technology provides advantages over other methods such as beat frequency termination, post distortion cancellation, derivative superposition, and a selection of optimum bias.

Figure 12:
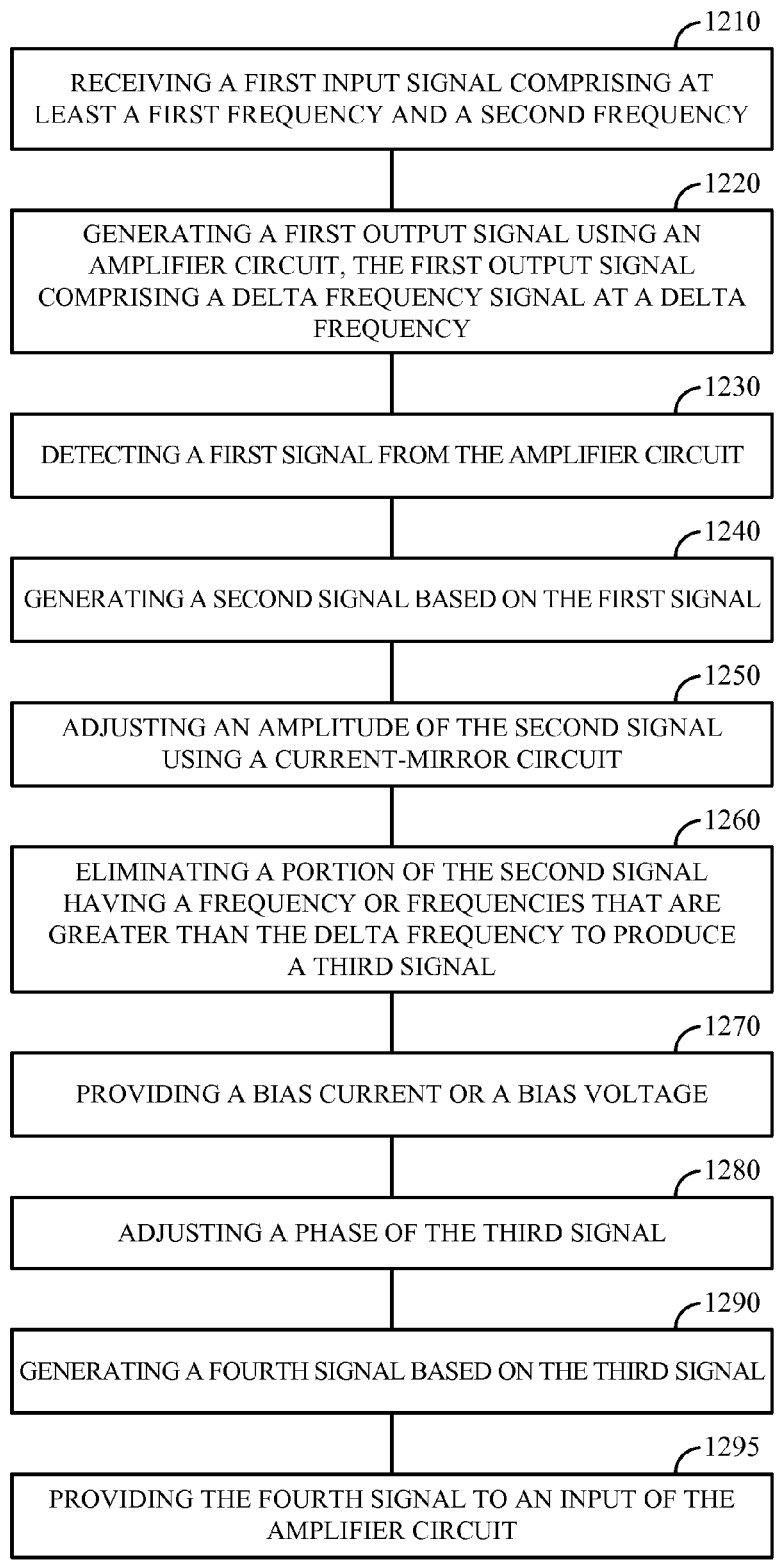
FIG. 12 illustrates an exemplary method of reducing intermodulation distortion in an electronic device according to one aspect of the disclosure.

FIG. 12 illustrates an exemplary method of reducing intermodulation distortion in an electronic device according to one aspect of the disclosure. The method comprises a process 1210 for receiving a first input signal comprising at least a first frequency and a second frequency and a process 1220 for generating a first output signal using an amplifier circuit. The first output signal comprises a delta frequency signal at a delta frequency. The delta frequency comprises a difference between the first frequency and the second frequency.

The method further comprises a process 1230 for detecting a first signal from the amplifier circuit, a process 1240 for generating a second signal based on the first signal, a process 1250 for adjusting an amplitude of the second signal using a current-mirror circuit, and a process 1260 for eliminating a portion of the second signal having a frequency or frequencies that are greater than the delta frequency to produce a third signal. The method further comprises a process 1270 for providing a bias current or a bias voltage, a process 1280 for adjusting a phase of the third signal, a process 1290 for generating a fourth signal based on the third signal, and a process 1295 for providing the fourth signal to an input of the amplifier circuit.

The fourth signal comprises a feedback signal corresponding to the delta frequency signal generated by the amplifier circuit, and an amplitude and/or a phase of the feedback signal is different from an amplitude and/or a phase of the delta frequency signal generated by the amplifier circuit, respectively.

Figure 13:
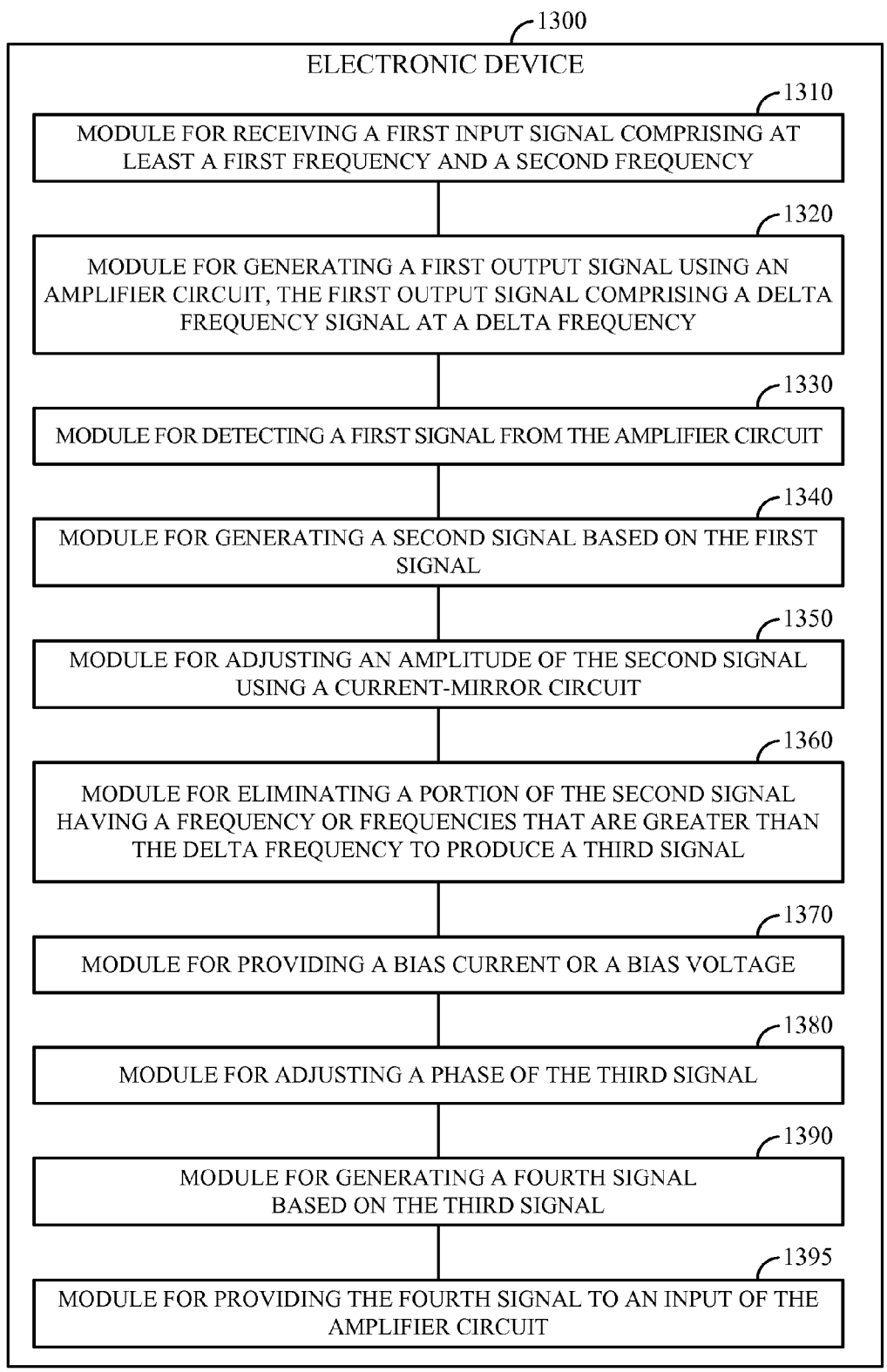
FIG. 13 is a conceptual block diagram illustrating an example of an electronic device for reducing intermodulation distortion according to one aspect of the disclosure.

FIG. 13 is a conceptual block diagram illustrating an example of an electronic device for reducing intermodulation distortion according to one aspect of the disclosure. An electronic device 1300 comprises a module 1310 for receiving a first input signal comprising at least a first frequency and a second frequency and a module 1320 for generating a first output signal using an amplifier circuit. The first output signal comprises a delta frequency signal at a delta frequency. The delta frequency comprises a difference between the first frequency and the second frequency.

The electronic device 1300 further comprises a module 1330 for detecting a first signal from the amplifier circuit, a module 1340 for generating a second signal based on the first signal, a module 1350 for adjusting an amplitude of the second signal using a current-mirror circuit, and a module 1360 for eliminating a portion of the second signal having a frequency or frequencies that are greater than the delta frequency to produce a third signal. The electronic device 1300 further comprises a module 1370 for providing a bias current or a bias voltage, a module 1380 for adjusting a phase of the third signal, a module 1390 for generating a fourth signal based on the third signal, and a module 1395 for providing the fourth signal to an input of the amplifier circuit.

The fourth signal comprises a feedback signal corresponding to the delta frequency signal generated by the amplifier circuit, and an amplitude and/or a phase of the feedback signal is different from an amplitude and/or a phase of the delta frequency signal generated by the amplifier circuit, respectively.

Those of skill in the art would appreciate that the various illustrative functions including, for example, blocks, modules, elements, components, methods, and algorithms described herein may be implemented in hardware, software, firmware, or any combination thereof. Various functions may be arranged differently (e.g., arranged in a different order, or partitioned in a different way) all without departing from the scope of the subject technology. While the subject technology is illustrated using n-channel MOSFET (NMOS) and p-channel MOSFET (PMOS) transistors (i.e., CMOS), the subject technology may be practiced utilizing other types of transistors (e.g., bipolar transistors or a combination of bipolar and CMOS transistors). A gate, a source, and a drain of a MOSFET may correspond to a base, an emitter, and a collector of a bipolar transistor.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

It should be noted that a term "coupled," "coupling" or a similar term as used in this disclosure or the claims may refer to a direct coupling or an indirect coupling. In addition, a term "connected," "connecting" or a similar term may refer to a direct connection or an indirect connection. Terms such as "comprising," "including," "having," "comprise," "include," "have," and similar terms are open-ended and do not exclude additional, unrecited elements or method steps.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An electronic device for reducing intermodulation distortion, comprising:

an amplifier circuit having an input and an output, the amplifier circuit having a first transistor, the amplifier circuit configured to receive a first input signal comprising at least a first frequency and a second frequency, the amplifier circuit configured to generate a first output signal, the first output signal comprising a delta frequency signal at a delta frequency, the delta frequency comprising a difference between the first frequency and the second frequency; and a linearizer having an input and an output, the input of the linearizer coupled to the amplifier circuit, the output of the linearizer coupled to the input of the amplifier circuit, the linearizer comprising:
- a signal detector circuit coupled to the amplifier circuit, the signal detector circuit having an input and an output, the signal detector circuit having a second transistor, the signal detector circuit configured to generate a second output signal, the second output signal comprising at least the delta frequency;
- a current-mirror circuit coupled to the signal detector circuit, the current-mirror circuit configured to adjust an amplitude of an input signal of the current-mirror circuit;
- a low pass filter coupled to the current-mirror circuit, the low pass filter configured to eliminate a portion of the second output signal having a frequency or frequencies that are greater than the delta frequency;
- a phase shifter having an input and an output, the output of the phase shifter coupled to the output of the linearizer, the phase shifter configured to adjust a phase of an input signal of the phase shifter, the phase shifter configured to generate a third output signal, the third output signal comprising a feedback signal corresponding to the delta frequency signal, an amplitude and/or a phase of the feedback signal being different from an amplitude and/or a phase of the delta frequency signal generated by the amplifier circuit, respectively; and
- a bias circuit configured to provide a bias current or a bias voltage to allow a DC voltage level of an output signal of the linearizer to be at a DC voltage level of the input of the amplifier circuit.

2. The electronic device of claim 1, wherein the amplifier circuit has a cascode transistor having a gate, a source, and a drain, and the first transistor has a gate, a source and a drain,
wherein the second transistor of the signal detector circuit has a gate, a source, and a drain,
wherein the current-mirror circuit has a fourth transistor and a fifth transistor, and each of the fourth transistor and the fifth transistor has a gate, a source, and a drain,
wherein the low pass filter has a resistor and a capacitor,
wherein the gate of the first transistor is configured to receive the first input signal, the drain of the first transistor is coupled to the source of the cascode transistor, the gate of the cascode transistor is coupled to a bias voltage and to the gate of the second transistor, and the source of the cascode transistor is coupled to the source of the second transistor,
wherein the drain of the fourth transistor is coupled to the drain of the second transistor, to the gate of the fourth transistor and to a first side of the resistor of the low pass filter, the gate of the fifth transistor is coupled to a second side of the resistor of the low pass filter, and the drain of the fifth transistor is coupled to the bias circuit, and
wherein the bias circuit is coupled to the phase shifter and is configured to supply a bias current to the phase shifter.

3. The electronic device of claim 2, wherein the second transistor is configured to duplicate the first output signal, the duplicated signal is smaller than a signal flowing through the source of the cascode transistor by N times, N is a ratio between the size of the cascode transistor and the size of the second transistor, and the size of the second transistor is smaller than the size of the cascode transistor by N times, and
wherein the fifth transistor is configured to allow a current to flow through its drain that is M times a current that flows through the drain of the fourth transistor, and M is a ratio between the size of the fifth transistor and the size of the fourth transistor.

4. The electronic device of claim 2, wherein the sizes of the second transistor, the cascode transistor, the fourth transistor and the fifth transistors are configured to allow a current flowing into the phase shifter to be 20 to 30 times less than a current flowing through the drain of the first transistor.

5. The electronic device of claim 1, wherein the amplifier circuit comprises a differential amplifier circuit, the amplifier circuit has a third transistor, a first cascode transistor, and a second cascode transistor, and each of the first transistor, the third transistor, the first cascode transistor and the second cascode transistor has a gate, a source, and a drain,
wherein the second transistor of the signal detector circuit has a gate, a source, and a drain,
wherein the current-mirror circuit has a fourth transistor and a fifth transistor, and each of the fourth transistor and the fifth transistor has a gate, a source, and a drain,
wherein the low pass filter has a resistor and a capacitor,
wherein the gate of the first transistor is configured to receive the first input signal, the drain of the first transistor is coupled to the source of the first cascode transistor, the third transistor is configured to receive the first input signal 180° out of phase, and the drain of the third transistor is coupled to the source of the second cascode transistor,
wherein the gate of the first cascode transistor is coupled to a bias voltage and to the gate of the second transistor, and the source of the first cascode transistor is coupled to the source of the second transistor,
wherein the drain of the fourth transistor is coupled to the drain of the second transistor, to the gate of the fourth transistor and to a first side of the resistor of the low pass filter, the gate of the fifth transistor is coupled to a second side of the resistor of the low pass filter, and the drain of the fifth transistor is coupled to the bias circuit,
wherein the bias circuit is coupled to the phase shifter and is configured to supply a bias current to the phase shifter, and
wherein the amplifier circuit has a second input, the linearizer has a second output, and the second output of the linearizer is coupled to the second input of the amplifier circuit.

6. The electronic device of claim 1, wherein the current-mirror circuit is tunable and is configured to selectively adjust the amplitude of the input signal of the current-mirror circuit by a selected amount.

7. The electronic device of claim 1, wherein the phase adjust is tunable and is configured to selectively adjust the phase of the input signal of the phase shifter by a selected amount.

8. The electronic device of claim 1, wherein the phase shifter is configured to adjust the phase of the input signal of the phase shifter by an amount less than 180°.

9. The electronic device of claim 1, wherein the amplifier circuit comprises a differential amplifier circuit, the amplifier circuit has a third transistor, and each of the first transistor and the third transistor has a gate, a source, and a drain,
wherein the signal detector circuit has a fourth transistor, and each of the second transistor and the fourth transistor of the signal detector circuit has a gate, a source, and a drain,
wherein the current-mirror circuit has a fifth transistor and a sixth transistor, and each of the fifth transistor and the sixth transistor has a gate, a source, and a drain,
wherein the low pass filter has a resistor and a capacitor,
wherein the gate of the first transistor is configured to receive the first input signal, the third transistor is configured to receive the first input signal 180° out of phase, the gate of the second transistor is coupled to a bias circuit and to the gate of the fourth transistor, and the drain of the second transistor is coupled to the drain of the fourth transistor, wherein the drain of the fifth transistor is coupled to the drain of the second transistor, to the drain of the fourth transistor, to the gate of the fifth transistor and to a first side of the resistor of the low pass filter, the gate of the sixth transistor is coupled to a second side of the resistor of the low pass filter, and the drain of the sixth transistor is coupled to the bias circuit, wherein the bias circuit is coupled to the phase shifter and to the signal detector circuit, and wherein the amplifier circuit has a second input, the linearizer has a second output, and the second output of the linearizer is coupled to the second input of the amplifier circuit.

10. The electronic device of claim 9, wherein an input of the second transistor is coupled to an input of the first transistor, and an input of the fourth transistor is coupled to an input of the third transistor, wherein the bias circuit is configured to provide a bias current or a bias voltage to the second transistor and to the fourth transistor so that the input of the second transistor is at a DC voltage level of the input of the amplifier circuit, and the input of the fourth transistor is at a DC voltage level of the second input of the amplifier circuit.

11. The electronic device of claim 9, wherein the amplifier circuit has a second output, wherein an input of the second transistor is coupled to the output of the amplifier circuit, and an input of the fourth transistor is coupled to the second output of the amplifier circuit, wherein the bias circuit is configured to provide a bias current or a bias voltage to the second transistor and to the fourth transistor so that the input of the second transistor is at a DC voltage level of the input of the amplifier circuit, and the input of the fourth transistor is at a DC voltage level of the second input of the amplifier circuit.

12. The electronic device of claim 9, wherein the amplifier circuit has a second output, wherein the amplifier circuit has a first cascode transistor and a second cascode transistor, and each of the first cascode transistor and the second cascode transistor has a gate, a source and a drain, wherein each of the gate of the first cascode transistor and the gate of the second cascode transistor is coupled to a bias voltage, the source of the first cascode transistor is coupled to the drain of the first transistor, the source of the second cascode transistor is coupled to the drain of the third transistor, the drain of the first cascode transistor is coupled to the output of the amplifier circuit, and the drain of the second cascode transistor is coupled to the second output of the amplifier circuit.

13. The electronic device of claim 1, wherein the amplifier circuit has a second input and a second output, wherein the signal detector circuit has a second input, wherein the input of the signal detector circuit is coupled to the input of the amplifier circuit, and the second input of the signal detector circuit is coupled to the second input of the amplifier circuit.

14. The electronic device of claim 1, wherein the amplifier circuit has a second input and a second output, wherein the signal detector circuit has a second input, wherein the input of the signal detector circuit is coupled to the output of the amplifier circuit, and the second input of the signal detector circuit is coupled to the second output of the amplifier circuit.

15. The electronic device of claim 1, wherein the amplitude and the phase of the feedback signal of the phase shifter are different from the amplitude and the phase of the delta frequency signal generated by the amplifier circuit, respectively.

16. The electronic device of claim 1, wherein the phase shifter comprises a shifter, a plurality of mixers, and a plurality of low pass filters.

17. An electronic system comprising the electronic device of claim 1 and further comprising a processing system, memory, a display, and a keypad.

18. A method of reducing intermodulation distortion in an electronic device, comprising:

receiving a first input signal comprising at least a first frequency and a second frequency;

generating a first output signal using an amplifier circuit, the first output signal comprising a delta frequency signal at a delta frequency, the delta frequency comprising a difference between the first frequency and the second frequency;

detecting a first signal from the amplifier circuit;

generating a second signal based on the first signal;

adjusting an amplitude of the second signal using a current-mirror circuit;

eliminating a portion of the second signal having a frequency or frequencies that are greater than the delta frequency to produce a third signal;

providing a bias current or a bias voltage;

adjusting a phase of the third signal;

generating a fourth signal based on the third signal; and providing the fourth signal to an input of the amplifier circuit, wherein the fourth signal comprises a feedback signal corresponding to the delta frequency signal generated by the amplifier circuit, and an amplitude and/or a phase of the feedback signal is different from an amplitude and/or a phase of the delta frequency signal generated by the amplifier circuit, respectively.

19. The method of claim 18, wherein the amplifier circuit comprises a first transistor and a cascode transistor, each of the first transistor and the cascode transistor has a gate, a source and a drain, and the drain of the first transistor is coupled to the source of the cascode transistor, wherein the detecting a first signal and the generating a second signal are performed by a second transistor having a gate, a source and a drain, and the gate of the second transistor is coupled to the gate of the cascode transistor, and the source of the second transistor is coupled to the source of the cascode transistor, wherein the receiving comprises receiving the first input signal at the gate of the first transistor, the generating a first output signal comprises generating the first output signal at the drain of the cascode transistor, the generating a second signal comprises generating a second current signal flowing through the second transistor based on a first current signal flowing through the cascode transistor, and the second current signal is smaller than the first current signal, wherein the adjusting comprises selectively adjusting an amplitude of the second current signal to generate a third current signal, and an amplitude of the third current signal is different from the amplitude of the second current signal, wherein the method further comprises adding the bias current and the third signal to produce a fifth signal, and wherein the adjusting a phase comprises selectively adjusting a phase of the fifth signal.

20. The method of claim 18, wherein the amplifier circuit comprises a differential amplifier circuit, the amplifier circuit has a first transistor, a first cascode transistor, a second transistor, and a second cascode transistor, and each of the first transistor, the first cascode transistor, the second transistor, and the second cascode transistor has a gate, a source and a drain,
  wherein the drain of the first transistor is coupled to the source of the first cascode transistor, and the drain of the second transistor is coupled to the source of the second cascode transistor,
  wherein the detecting a first signal and the generating a second signal are performed by a third transistor having a gate, a source and a drain, and the gate of the third transistor is coupled to the gate of the first cascode transistor, and the source of the third transistor is coupled to the source of the first cascode transistor,
  wherein the receiving comprises receiving the first input signal at the gate of the first transistor and receiving the first input signal 180° out of phase at the gate of the second transistor,
  wherein the generating a first output signal comprises generating the first output signal at the drain of the first cascode transistor and generating a second output signal at the drain of the second cascode transistor, the generating a second signal comprises generating a second current signal flowing through the third transistor based on a first current signal flowing through the first cascode transistor, and the second current signal is smaller than the first current signal,
  wherein the adjusting comprises selectively adjusting an amplitude of the second current signal to generate a third current signal, and an amplitude of the third current signal is different from the amplitude of the second current signal,
  wherein the method further comprises adding the bias current and the third signal to produce a fifth signal, and
  wherein the adjusting a phase comprises selectively adjusting a phase of the fifth signal.

21. The method of claim 18, wherein the amplifier circuit comprises a differential amplifier circuit, the amplifier circuit has a first transistor and a second transistor, and each of the first transistor and the second transistor has a gate, a source and a drain,
  wherein the detecting a first signal and the generating a second signal are performed by a third transistor and a fourth transistor, each of the third and fourth transistors has a gate, a source and a drain,
  wherein the gate of the third transistor and the gate of the fourth transistor are coupled to a bias circuit, and the drain of the third transistor is coupled to the drain of the fourth transistor,
  wherein the receiving comprises receiving the first input signal at the gate of the first transistor and receiving the first input signal 180° out of phase at the gate of the second transistor,
  wherein the detecting comprises detecting at the gate of the third transistor a first voltage signal from the amplifier circuit and detecting at the gate of the fourth transistor a second voltage signal from the amplifier circuit, the first signal comprises the first voltage signal and the second voltage signal,
  wherein the generating a second signal comprises passing even order harmonics of the first signal and eliminating odd order harmonics of the first signal,
  wherein the adjusting comprises selectively adjusting an amplitude of the second signal to generate a current signal, and an amplitude of the current signal is different from the amplitude of the second signal,
  wherein the method further comprises adding the bias current and the third signal to produce a fifth signal, and
  wherein the adjusting a phase comprises selectively adjusting a phase of the fifth signal.

22. The method of claim 18, wherein the amplifier circuit has a first input, a second input, a first output and a second output,
  wherein the detecting is performed by a signal detector circuit, and the signal detector circuit has a third input and a fourth input,
  wherein the third input and the fourth input of the signal detector circuit are coupled to the first input and the second input of the amplifier circuit, respectively, or coupled to the first output and the second output of the amplifier circuit, respectively.

23. An electronic device for reducing intermodulation distortion, comprising:
  means for receiving a first input signal comprising at least a first frequency and a second frequency;
  means for generating a first output signal using an amplifier circuit, the first output signal comprising a delta frequency signal at a delta frequency, the delta frequency comprising a difference between the first frequency and the second frequency;
  means for detecting a first signal from the amplifier circuit;
  means for generating a second signal based on the first signal;
  means for adjusting an amplitude of the second signal using a current-mirror circuit;
  means for eliminating a portion of the second signal having a frequency or frequencies that are greater than the delta frequency to produce a third signal;
  means for providing a bias current or a bias voltage;
  means for adjusting a phase of the third signal;
  means for generating a fourth signal based on the third signal; and
  means for providing the fourth signal to an input of the amplifier circuit,
  wherein the fourth signal comprises a feedback signal corresponding to the delta frequency signal generated by the amplifier circuit, and an amplitude and/or a phase of the feedback signal is different from an amplitude and/or a phase of the delta frequency signal generated by the amplifier circuit, respectively.

24. The electronic device of claim 23, wherein the amplifier circuit comprises a first transistor and a cascode transistor, each of the first transistor and the cascode transistor has a gate, a source and a drain, and the drain of the first transistor is coupled to the source of the cascode transistor,
  wherein the means for detecting a first signal and the means for generating a second signal are performed by a second transistor having a gate, a source and a drain, and the gate of the second transistor is coupled to the gate of the cascode transistor, and the source of the second transistor is coupled to the source of the cascode transistor,
  wherein the means for receiving comprises means for receiving the first input signal at the gate of the first transistor, the means for generating a first output signal comprises means for generating the first output signal at the drain of the cascode transistor, the means for generating a second signal comprises means for generating a second current signal flowing through the second transistor based on a first current signal flowing through the cascode transistor, and the second current signal is smaller than the first current signal, wherein the means for adjusting comprises means for selectively adjusting an amplitude of the second current signal to generate a third current signal, and an amplitude of the third current signal is different from the amplitude of the second current signal, wherein the electronic device further comprises means for adding the bias current and the third signal to produce a fifth signal, and wherein the means for adjusting a phase comprises means for selectively adjusting a phase of the fifth signal.

25. The electronic device of claim 23, wherein the amplifier circuit comprises a differential amplifier circuit, the amplifier circuit has a first transistor, a first cascode transistor, a second transistor, and a second cascode transistor, and each of the first transistor, the first cascode transistor, the second transistor, and the second cascode transistor has a gate, a source and a drain, wherein the drain of the first transistor is coupled to the source of the first cascode transistor, and the drain of the second transistor is coupled to the source of the second cascode transistor, wherein the means for detecting a first signal and the means for generating a second signal are performed by a third transistor having a gate, a source and a drain, and the gate of the third transistor is coupled to the gate of the first cascode transistor, and the source of the third transistor is coupled to the source of the first cascode transistor, wherein the means for receiving comprises means for receiving the first input signal at the gate of the first transistor and receiving the first input signal 180° out of phase at the gate of the second transistor, wherein the means for generating a first output signal comprises means for generating the first output signal at the drain of the first cascode transistor and generating a second output signal at the drain of the second cascode transistor, the means for generating a second signal comprises means for generating a second current signal flowing through the third transistor based on a first current signal flowing through the first cascode transistor, and the second current signal is smaller than the first current signal, wherein the means for adjusting comprises means for selectively adjusting an amplitude of the second current signal to generate a third current signal, and an amplitude of the third current signal is different from the amplitude of the second current signal, wherein the electronic device further comprises means for adding the bias current and the third signal to produce a fifth signal, and wherein the means for adjusting a phase comprises means for selectively adjusting a phase of the fifth signal.

26. The electronic device of claim 23, wherein the amplifier circuit comprises a differential amplifier circuit, the amplifier circuit has a first transistor and a second transistor, and each of the first transistor and the second transistor has a gate, a source and a drain, wherein the means for detecting a first signal and the means for generating a second signal are performed by a third transistor and a fourth transistor, each of the third and fourth transistors has a gate, a source and a drain, wherein the gate of the third transistor and the gate of the fourth transistor are coupled to a bias circuit, and the drain of the third transistor is coupled to the drain of the fourth transistor, wherein the means for receiving comprises means for receiving the first input signal at the gate of the first transistor and receiving the first input signal 180° out of phase at the gate of the second transistor, wherein the means for detecting comprises means for detecting at the gate of the third transistor a first voltage signal from the amplifier circuit and means for detecting at the gate of the fourth transistor a second voltage signal from the amplifier circuit, the first signal comprises the first voltage signal and the second voltage signal, wherein the means for generating a second signal comprises means for passing even order harmonics of the first signal and eliminating odd order harmonics of the first signal, wherein the means for adjusting comprises means for selectively adjusting an amplitude of the second signal to generate a current signal, and an amplitude of the current signal is different from the amplitude of the second signal, wherein the electronic device further comprises means for adding the bias current and the third signal to produce a fifth signal, and wherein the means for adjusting a phase comprises means for selectively adjusting a phase of the fifth signal.

* * * * *